United States Patent
Bai

(10) Patent No.: US 11,699,708 B2
(45) Date of Patent: Jul. 11, 2023

(54) SUB-PIXEL STRUCTURE, DISPLAY PANEL AND CONTROL METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventor: Aojun Bai, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 226 days.

(21) Appl. No.: 16/969,325

(22) PCT Filed: Jan. 2, 2020

(86) PCT No.: PCT/CN2020/070122
§ 371 (c)(1),
(2) Date: Aug. 12, 2020

(87) PCT Pub. No.: WO2020/143530
PCT Pub. Date: Jul. 16, 2020

(65) Prior Publication Data
US 2021/0050374 A1 Feb. 18, 2021

(30) Foreign Application Priority Data
Jan. 11, 2019 (CN) .......................... 201910028181.1

(51) Int. Cl.
*H01L 27/12* (2006.01)
*G09G 3/20* (2006.01)
*G09G 5/10* (2006.01)

(52) U.S. Cl.
CPC .............. *H01L 27/124* (2013.01); *G09G 3/20* (2013.01); *G09G 5/10* (2013.01); *H01L 27/1222* (2013.01); *G09G 2330/028* (2013.01)

(58) Field of Classification Search
CPC ........ G09G 5/10; G09G 3/344; G09G 3/3453; G09G 3/20; G09G 2330/028; H01L 27/124; H01L 27/1222
See application file for complete search history.

(56) References Cited

U.S. PATENT DOCUMENTS

| 7,177,067 B1 | 2/2007 | Sakamoto |
| 2003/0165016 A1 | 9/2003 | Whitehead et al. |

(Continued)

FOREIGN PATENT DOCUMENTS

| CN | 1639625 A | 7/2005 |
| CN | 101666908 A | 3/2010 |

(Continued)

OTHER PUBLICATIONS

International search report of PCT application No. PCT/CN2020/070122 dated Apr. 1, 2020.

(Continued)

*Primary Examiner* — Shaheda A Abdin
(74) *Attorney, Agent, or Firm* — Lippes Mathias LLP

(57) ABSTRACT

A sub-pixel structure includes: a first functional layer and a second functional layer which are oppositely arranged, a conductive structure therebetween, and a plurality of electrodes on at least one side of the first functional layer. The first functional layer includes an insulating region, the second functional layer includes a target light-shielding region and a target light-transmitting region, orthographic projections of both the conductive structure and the target light-transmitting region on the first functional layer are partial regions of the insulating region, and orthographic (Continued)

projections of the plurality of electrodes on the first functional layer are outside the insulating region; and the conductive structure is configured to move in the insulating region under the action of voltages loaded on the plurality of electrodes to adjust a luminous flux of light emitted from the target light-transmitting region.

15 Claims, 14 Drawing Sheets

(56) References Cited

U.S. PATENT DOCUMENTS

| | | | |
|---|---|---|---|
| 2004/0036953 A1* | 2/2004 | Davis | G02B 26/026 359/296 |
| 2008/0266508 A1 | 10/2008 | Kim | |
| 2012/0147453 A1 | 6/2012 | Li et al. | |
| 2012/0262777 A1 | 10/2012 | Lee et al. | |
| 2013/0120678 A1* | 5/2013 | Chao | F21K 9/60 977/774 |
| 2013/0120688 A1* | 5/2013 | Chao | F21V 9/02 362/277 |
| 2014/0085705 A1 | 3/2014 | Kang et al. | |
| 2018/0329268 A1 | 11/2018 | Li et al. | |
| 2019/0361293 A1 | 11/2019 | Hong et al. | |

FOREIGN PATENT DOCUMENTS

| | | |
|---|---|---|
| CN | 101750767 A | 6/2010 |
| CN | 101813856 A | 8/2010 |
| CN | 102236224 A | 11/2011 |
| CN | 102540534 A | 7/2012 |
| CN | 102597864 A | 7/2012 |
| CN | 103163672 A | 6/2013 |
| CN | 104317132 A | 1/2015 |
| CN | 105629556 A | 6/2016 |
| CN | 106125410 A | 11/2016 |
| CN | 106647065 A | 5/2017 |
| CN | 106909011 A | 6/2017 |
| CN | 109656075 A | 4/2019 |
| KR | 20050003497 A | 1/2005 |
| TW | 200947392 A | 11/2009 |
| WO | WO2018151513 A1 | 8/2018 |

OTHER PUBLICATIONS

First office action of Chinese application No. 201910028181.1 dated Feb. 3, 2020.

* cited by examiner

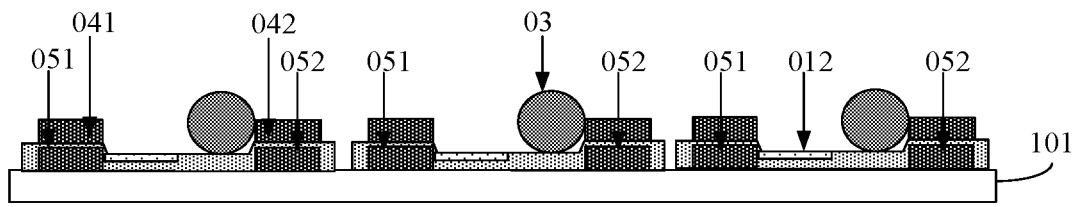
FIG. 19
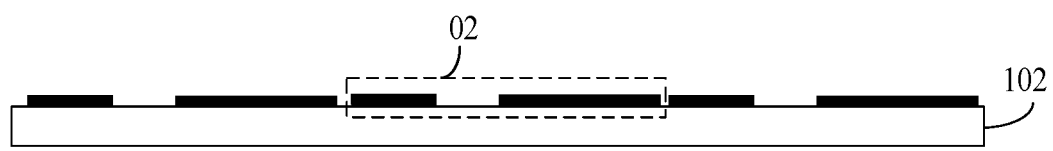
FIG. 20
Adjusting voltages loaded on the plurality of electrodes in the sub-pixel substrate such that the conductive structure in the sub-pixel structure moves in the insulating region of the sub-pixel structure — 2101
FIG. 21

SUB-PIXEL STRUCTURE, DISPLAY PANEL AND CONTROL METHOD THEREFOR, AND DISPLAY DEVICE

This application is a 371 of PCT Application No. PCT/CN2020/070122, filed on Jan. 2, 2020, which claims priority to Chinese Patent Application No. 201910028181.1, filed on Jan. 11, 2019 and entitled "SUB-PIXEL STRUCTURE, DISPLAY PANEL AND METHOD FOR MANUFACTURING SAME AND METHOD FOR CONTROLLING SAME, AND DISPLAY DEVICE", the entire contents of which are incorporated herein by reference.

TECHNICAL FIELD

The present disclosure relates to the technical field of display, and in particular, relates to a sub-pixel structure, a display panel and a method for controlling the same, and a display device.

BACKGROUND

With the development of the display technologies, various display panels have appeared. For example, electronic paper is a display panel with paper-like display effects.

SUMMARY

In one aspect, a sub-pixel structure is provided. The sub-pixel structure includes: a first functional layer and a second functional layer which are opposite to each other, a conductive structure between the first functional layer and the second functional layer, and a plurality of electrodes on at least one side of the first functional layer, the first functional layer includes an insulating region, the second functional layer includes a target light-shielding region and a target light-transmitting region, wherein orthographic projections of both the conductive structure and the target light-transmitting region on the first functional layer are partial regions of the insulating region, and orthographic projections of the plurality of electrodes on the first functional layer are outside the insulating region; and the conductive structure is configured to move in the insulating region under the action of voltages loaded on the plurality of electrodes to adjust a luminous flux of light emitted from the target light-transmitting region.

In another aspect, a display panel is provided. The display panel includes: a first substrate and a second substrate which are arranged oppositely, and a plurality of sub-pixel structures between the first substrate and the second substrate and arranged in an array, wherein the sub-pixel structure is the foregoing sub-pixel structure.

In another aspect, a method for controlling a display panel is provided, the display panel being the above display panel, the method being performed by a display controller which is connected to all the plurality of electrodes in the sub-pixel structure of the display panel. The method includes:

adjusting voltages loaded on the plurality of electrodes in the sub-pixel structure such that a conductive structure in each of the sub-pixel structures moves in an insulating region of the sub-pixel structure.

In another aspect, a display device is provided. The display device includes a display panel and a display controller. The display panel is the display panel as described above, and the display controller is the display controller as described above.

BRIEF DESCRIPTION OF THE ACCOMPANYING DRAWINGS

FIG. 19 is a schematic diagram of another manufacturing process of a display panel according to an embodiment of the present disclosure;

FIG. 20 is a schematic diagram of another manufacturing process of a display panel according to an embodiment of the present disclosure;

FIG. 21 is a flowchart of a method for controlling a display panel according to an embodiment of the present disclosure;

DETAILED DESCRIPTION

For clearer descriptions of the principles, technical solutions, and advantages of the present disclosure, specific embodiments of the present disclosure are described hereinafter in detail with reference to the accompanying drawings.

In the related art, electronic paper includes a plurality of electrode patterns arranged oppositely and a plurality of capsules disposed among the plurality of electrode patterns (each of the capsules may be considered as a sub-pixel structure in the electronic paper), and each of the capsules is wrapped with positively charged white particles and negatively charged black particles. Distribution of the black particles and the while particles in each of the capsules can be adjusted by adjusting a voltage applied to each of regions in the plurality of electrode patterns, such that the electronic paper displays a black-and-white image. However, due to a limitation of a manufacturing process, a volume of the capsules in the electronic paper is usually larger, and thus a density of pixels in the electronic paper is smaller and the display effect is poorer.

An embodiment of the present disclosure provides a display panel. The density of pixels of the display panel is larger, and thus the display effect of the display panel may be improved.

Figure 1:
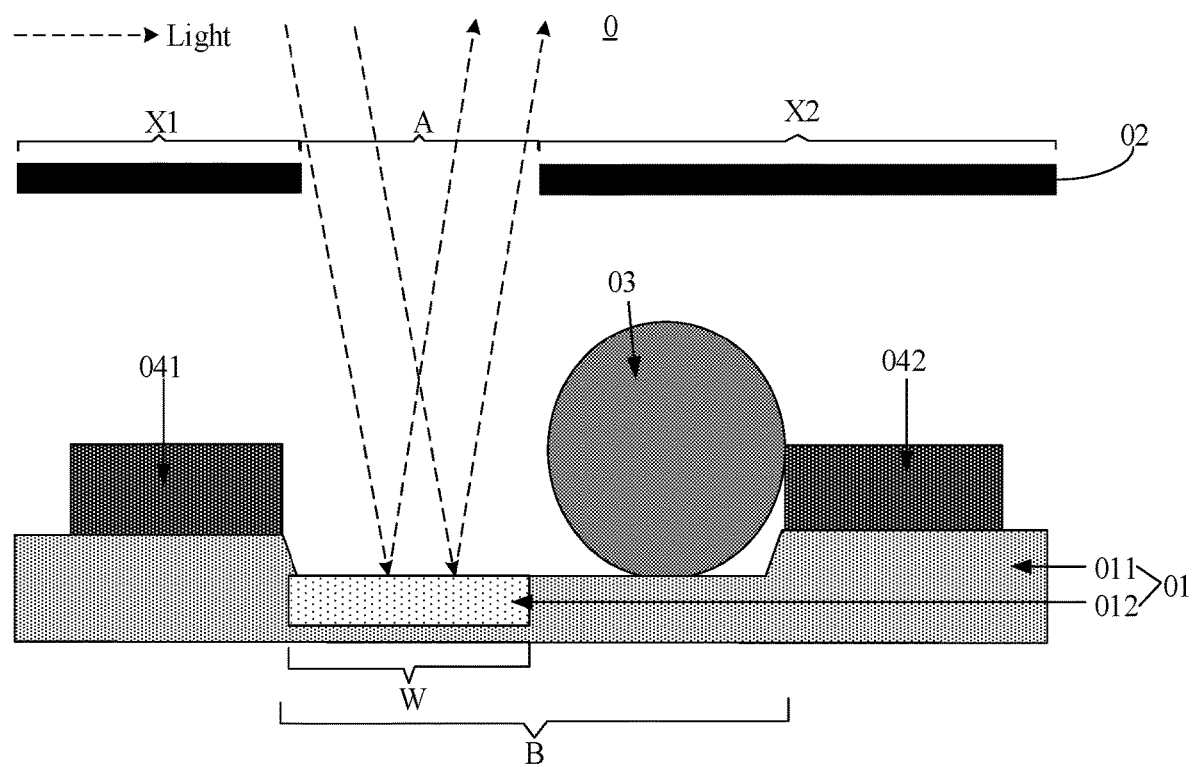
FIG. 1 is a schematic diagram of a sub-pixel structure according to an embodiment of the present disclosure.

For example, FIG. 1 is a schematic diagram of a sub-pixel structure as defined in an embodiment of the present disclosure. As shown in FIG. 1, the sub-pixel structure 0 may include: a first functional layer 01 and a second functional layer 02 which are arranged opposite to each other, a conductive structure 03 disposed between the first functional layer 01 and the second functional layer 02, and a plurality of electrodes disposed on at least one side of the first functional layer 01 (such as a first switch electrode 041 and a second switch electrode 042 disposed on a side, proximal to the second functional layer 02, of the first functional layer 01 in FIG. 1).

The first functional layer 01 includes an insulating region B, and the second functional layer 02 includes a target light-shielding region (including a region X1 and a region X2 in FIG. 1) and a target light-transmitting region A. Both orthographic projections of the conductive structure 03 and the target light-transmitting region A on the first functional layer 01 are partial regions of the insulating region B, and orthographic projections of the plurality of electrodes on first functional layer 01 are outside the insulating region. It can be seen that the insulating region B is disposed among the plurality of electrodes, and the conductive structure 03 may be in the insulating region B.

The conductive structure 03 is configured to move in the insulating region B under the action of voltages loaded on the plurality of electrodes to adjust a luminous flux of light emitted from the target light-transmitting region A.

Optionally, the conductive structure 03 may be a conductive ball shown in FIG. 1, or the conductive structure 03 may further be of other shapes, for example, the conductive structure 03 is a cubic structure, or the like, which is not limited in the embodiment of the present disclosure.

In conclusion, in the sub-pixel structure according to the embodiment of the present disclosure, the conductive structure can move in the insulating region under the action of the voltages loaded on the plurality of electrodes to change a light emission area of the target light-transmitting region, thereby changing a luminance of the sub-pixel structure and achieving a bright state or a dark state of the sub-pixel structure. Due to the mature manufacturing process of the conductive structure and the electrodes, the conductive structure and the electrodes with small size can be generally manufactured, and thus the sub-pixel structure with small size can be manufactured. In this way, the density of pixels of the display panel where the sub-pixel structure is disposed is larger, a resolution of the display panel is higher and the display effect of the display panel is improved.

For example, in the related art, the capsule in the electronic paper is generally spherical and a diameter of the capsule is generally 100 microns or more. However, the sub-pixel structure according to the embodiment of the present disclosure may be rectangular, and a length and a width of the sub-pixel structure may reach 10 microns or less. It can be seen that the size of the sub-pixel structure according to the embodiment of the present disclosure is far less than the size of the capsule in the related art.

Furthermore, the plurality of capsules in the electronic paper cannot be uniformly distributed among the plurality of electrode patterns. Therefore, the display effects of all regions of the electronic paper are different and the display uniformity of all regions is poorer. In the display panel including the sub-pixel structures according to the present disclosure, the sub-pixel structures may be uniformly distributed, such that the display effects of all regions of the display panel are consistent and the display effect of the display panel is improved.

In addition, since the sub-pixel structure according to the present disclosure adjusts the light emission quantity of the target light-transmitting region by movement of the conductive structure, the sub-pixel structure may adjust the light emission quantity without a polarizer and a light utilization ratio of the display panel is high where the sub-pixel structure is disposed.

Optionally, in solutions of the embodiments of the present disclosure, the principle of controlling movement of the conductive structure 03 by adjusting the voltage applied to the plurality of electrodes is as follows: when it is necessary to control the conductive structure 03 to move towards one of the plurality of electrodes, a voltage may be applied to the electrode, but not be applied to another electrode, such that an electric field is formed at a position of the electrode to which the voltage is applied, and the uncharged conductive structure 03 moves towards the electrode to which the voltage is applied under the attraction of an electric field force.

Optionally, still referring to FIG. 1, a surface, facing the second functional layer 02, of the first functional layer 01 is provided with a light-adjusting region W disposed in the insulating region B, and the light-adjusting region W may be a partial region or an entire region of the insulating region B (taking the light-adjusting region W is the partial region of the insulating region B as an example in FIG. 1). The light-adjusting region W is reflective and an orthographic projection of the target light-transmitting region A on the first functional layer 01 is within the light-adjusting region W.

For example, the first functional layer 01 may include: a functional layer body 0111 and an insulating block 012 disposed on a side, proximal to the second functional layer

02, of the functional layer body 0111 (a side, distal from the second functional layer 02, of the conductive structure 03). A region where the insulating block 012 is disposed is the light-adjusting region W, the conductive structure 03 is light-shielding, and a side, proximal to the second functional layer 02, of the insulating block 012 is reflective. A material of the insulating block 012 may only include a reflective material, or a material of the insulating block 012 may not only include a reflective material, but also include other materials. For example, the insulating block 012 may include a double-layer structure. In the double-layer structure, a material of one layer, proximal to the second functional layer 02, is a reflective material; and a material of the other layer, distal from the second functional layer 02 is not the reflective material, that is, the material of other layer distal from the second functional layer 02 is the material that is not reflective.

Since the second functional layer 02 is provided with the target light-shielding region and the target light-shielding region A, light from a side, distal from the first functional layer 01, of the second functional layer 02 can be emitted into the sub-pixel structure 0 after passing through the target light-transmitting region A. As shown in FIG. 1, when it is necessary to control the sub-pixel structure 0 to achieve bright state display, the conductive structure 03 may be controlled to move towards one electrode (such as a second switch electrode 042), distal from the target light-transmitting region A, of the plurality of electrodes, and the conductive structure 03 does not shield the target light-transmitting region A (that is, an orthographic projection of the conductive structure 03 on the second functional layer 02 is outside the target light-transmitting region A, and an orthographic projection of the target light-transmitting region A on the first functional layer 01 is outside the orthographic projection of the conductive structure 03 on the first functional layer 01). In this case, incident light from the target light-transmitting region A arrives at the insulating block 012 and is reflected by the insulating block 012 to the target light-transmitting region A, and is emitted from the sub-pixel structure 0 in the target light-transmitting region A, such that a side, where the second functional layer 02 is disposed, of the sub-pixel structure 0 achieves bright state display.

Figure 2:
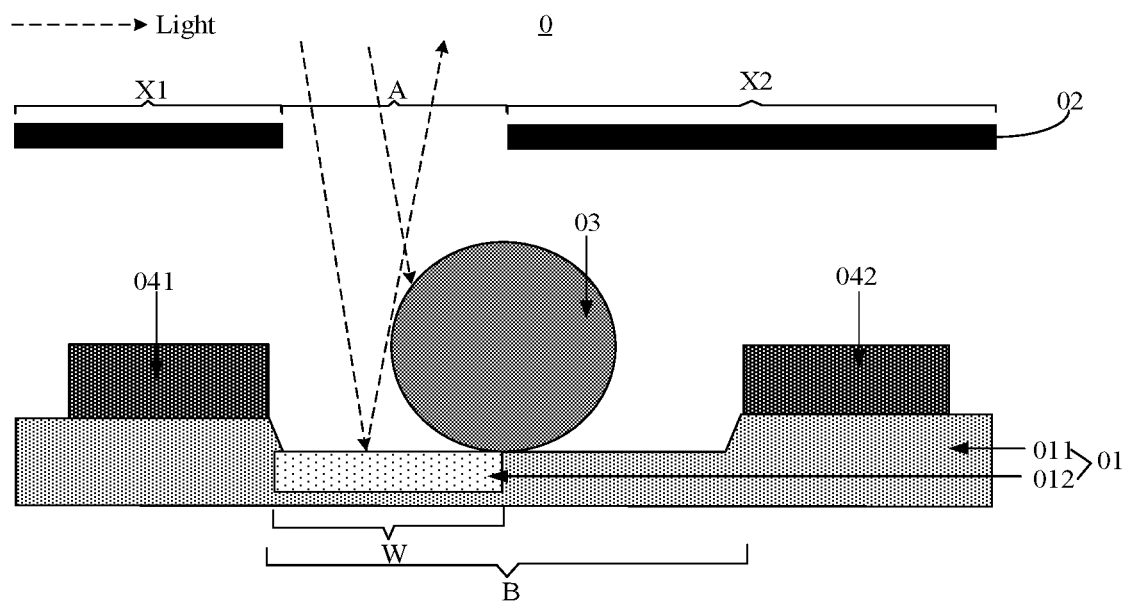
FIG. 2 is a schematic diagram of another sub-pixel structure according to an embodiment of the present disclosure.

When a luminance of the side, where the second functional layer 02 is disposed, of the sub-pixel structure 0 is required to be adjusted, as shown in FIG. 2, the conductive structure 03 may be controlled to move towards a region among the plurality of electrodes, and thus shield a part of the target light-transmitting region A (that is, the orthographic projection of the conductive structure 03 on the second functional layer 02 partially overlaps the target light-transmitting region A, and the orthographic projection of the target light-transmitting region A on the first functional layer 01 partially overlaps the orthographic projection of the conductive structure 03 on the first functional layer 01). In this way, a part of incident light from the target light-transmitting region A is shielded by the conductive structure 03 and cannot be emitted to the insulating block 012, thereby reducing light reflected by the insulating block 012, reducing light emitted to the target light-transmitting region A from the insulating block 012, and reducing the luminance of the side, where the second functional layer 02 is disposed, of the sub-pixel structure.

Figure 3:
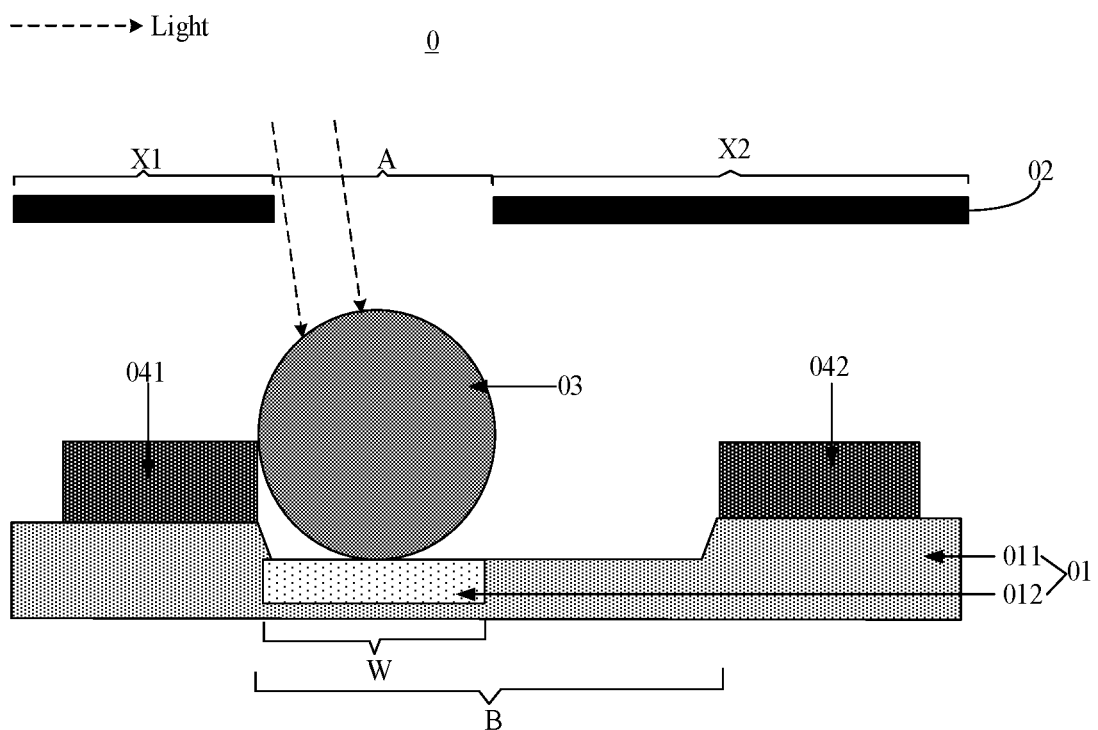
FIG. 3 is a schematic diagram of another sub-pixel structure according to an embodiment of the present disclosure.

Further, when it is necessary to control the side, where the second functional layer 02 is disposed, of the sub-pixel structure 0 to achieve dark state display, as shown in FIG. 3, the conductive structure 03 in a light-adjusting structure 03 may be controlled to move towards one electrode (such as a first switch electrode 041), proximal to the target light-transmitting region, of the plurality of electrodes, and the conductive structure 03 completely shields the target light-transmitting region A (that is, the orthographic projection of the conductive structure 03 on the second functional layer 02 covers the target light-transmitting region A, and the orthographic projection of the target light-transmitting region A on the first functional layer 01 is within the orthographic projection of the conductive structure 03 on the first functional layer 01). In this case, incident light from the target light-transmitting region A is completely shielded by the conductive structure 03 and cannot arrive at the insulating block 012. In this way, the insulating block 012 cannot reflect the incident light from the target light-transmitting region A, such that the side, where the second functional layer 02 is disposed, of the sub-pixel structure achieves dark state display.

Optionally, the plurality of electrodes may include: a first switch electrode 041 and a second switch electrode 042, wherein the first switch electrode 041 is proximal to the target light-transmitting region A and the second switch electrode 042 is distal from the target light-transmitting region A. The conductive structure 03 is configured to move between a first position (a position of the conductive structure 03 in FIG. 3) and a second position (a position of the conductive structure 03 in FIG. 1) in the insulating region B under the action of voltages loaded on the plurality of electrodes. The first position is a position which is most proximal to the first switch electrode 041 in the insulating region B, and the second position is a position which is most proximal to the second switch electrode 042 in the insulating region B.

When the conductive structure 03 is disposed at the first position (the position of the conductive structure 03 in FIG. 3), the orthographic projection of the conductive structure 03 on the second functional layer 02 covers the target light-transmitting region A (the orthographic projection of the target light-transmitting region A on the first functional layer 01 is within the orthographic projection of the conductive structure 03 on the first functional layer 01), and at this time, the sub-pixel structure achieves dark state display. When the conductive structure 03 is disposed at the second position (the position of the conductive structure 03 in FIG. 1), the orthographic projection of the conductive structure 03 on the second functional layer 02 is outside the target light-transmitting region A (the orthographic projection of the target light-transmitting region A on the first functional layer 01 is outside the orthographic projection of the conductive structure 03 on the first functional layer 01), and at this time, the sub-pixel structure achieves bright state display.

Optionally, the first switch electrode 041 and the second switch electrode 042 may be disposed on the same side (a side, proximal to the second functional layer 02, of the first functional layer 01, or a side, distal from the second functional layer 02, of the first functional layer 01) of the first functional layer 01. The first switch electrode 041 and the second switch electrode 042 may be respectively disposed on two sides of the first functional layer 01, which is not limited in the embodiment of the present disclosure. The embodiment of the present disclosure takes that the first switch electrode 041 and the second switch electrode 042 are disposed on the side, proximal to the second functional layer 02, of the first functional layer 01 as an example.

Figure 4:
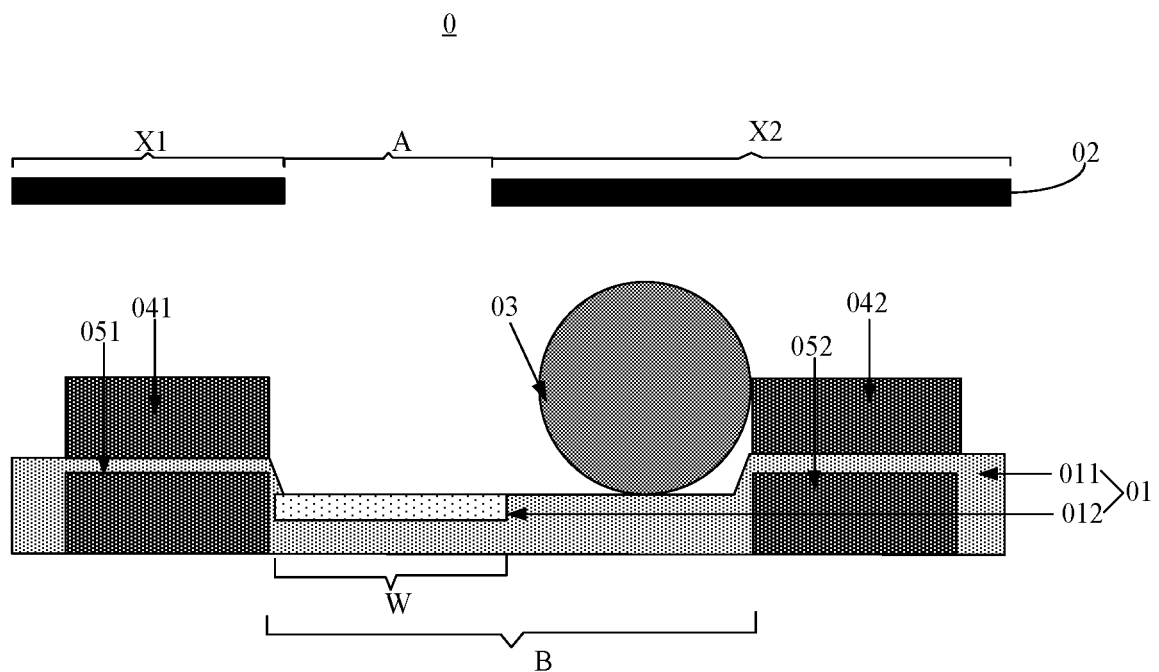
FIG. 4 is a schematic diagram of another sub-pixel structure according to an embodiment of the present disclosure.

Optionally, as shown in FIG. 4, when the first switch electrode 041 and the second switch electrode 042 are disposed on the side, proximal to the second functional layer 02, of the first functional layer 01, the plurality of electrodes may further include: a first drive electrode 051 and a second drive electrode 052 which are disposed on a side, distal from the second functional layer 02, of the first functional layer 01.

The first switch electrode 041 and the first drive electrode 051 are disposed on the same side of the insulating region B (a left side of the insulating region B in FIG. 4), and the second switch electrode 042 and the second drive electrode 052 are disposed on the same side of the insulating region B (a right side of the insulating region B in FIG. 4). Optionally, the orthographic projection of the first switch electrode 041 on the first functional layer 01 may at least partially overlap (for example, completely overlap) the orthographic projection of the first drive electrode 051 on the first functional layer 01, and the orthographic projection of the second switch electrode 042 on the first functional layer 01 may at least partially overlap (for example, completely overlap) the orthographic projection of the second functional layer 052 on the first functional layer 01.

When the conductive structure 03 is disposed at the first position (that is the position, most proximal to the first switch electrode 041, of the insulating region B) of the insulating region B, the conductive structure 03 is electrically connected to the first switch electrode 041. Under the action of the insulating region B in the first functional layer 01, the conductive structure 03 is insulated from both the first drive electrode 051 and the second drive electrode 052. When the conductive structure 03 is disposed at the second position (that is the position, most proximal to the second switch electrode 042, of the insulating region B) of the insulating region B, the conductive structure 03 is electrically connected to the second switch electrode 042; and the conductive structure 03 is insulated from both the first drive electrode 051 and the second drive electrode 052 under the action of the insulating region B in the first functional layer 01.

Optionally, when the sub-pixel structure includes the first switch electrode 041, the second switch electrode 042, the first drive electrode 051 and the second drive electrode 052, the conductive structure 03 may be configured to move in the insulating region B under the action of the voltages loaded on the first switch electrode 041, the second switch electrode 042, the first drive electrode 051 and the second drive electrode 052. That is, the conductive structure 03 may further be controlled to move by adjusting the voltages applied to the four electrodes to adjust the luminance of the light emitted from the target light-transmitting region in the sub-pixel structure.

Optionally, the principle of controlling the conductive structure 03 to move by adjusting the voltages applied to the four electrodes is as follows: when it is necessary to control the conductive structure 03 to move, first voltages may be firstly applied to both the first switch electrode 041 and the second switch electrode 042, such that electric fields are formed at the positions of the first switch electrode 041 and the second switch electrode 042. At this time, the uncharged conductive structure 03 disposed between the first switch electrode 041 and the second switch electrode 042 will move towards a switch electrode proximal to the conductive structure 03 under the action of the electric fields formed by the two switch electrodes until the conductive structure 03 is electrically connected to the switch electrode. Both the voltage on the conductive structure 03 and the voltage on the switch electrode to which the conductive structure 03 is electrically connected may be the first voltage.

After the conductive structure 03 is charged, the first voltage may be supplied to one of the first drive electrode 051 and the second drive electrode 052, and the second voltage may be supplied to the other according to the first voltage on the conductive structure 03 and a direction in which the conductive structure 03 is required to be controlled to move.

For example, when it is necessary to control the conductive structure to move in a direction which is proximal to the first drive electrode 051 and distal from the second drive electrode 052, the second voltage may be applied to the first drive electrode 051 and the first voltage may be applied to the second drive electrode 052. Therefore, the conductive structure 03 with the first voltage is attracted by the first drive electrode 051 with the second voltage and be repelled by the second drive electrode 052 with the first voltage, thereby moving towards the first drive electrode 051. When it is necessary to control the conductive structure to move in a direction which is proximal to the second drive electrode 052 and distal from the first drive electrode 051, the first voltage may be applied to the first drive electrode 051 and the second voltage may be applied to the second drive electrode 052. Therefore, the conductive structure 03 with the first voltage is attracted by the second drive electrode 052 with the second voltage and be repelled by the first drive electrode 051 with the first voltage, thereby moving towards the second drive electrode 052.

Optionally, a side, proximal to the second functional layer 02, of the first function layer 01 in the insulating region B may be set to be recessed to ensure that the conductive structure 03 is disposed in the insulating region B all the time. Therefore, the conductive structure 03 can be prevented from rolling out of the insulating region B during the movement under the limiting action of the recess.

Optionally, the sub-pixel structure according to the embodiment of the present disclosure may emit light as same as ambient light, and may further emit light of a certain color of ambient light. Several possible implementations of the sub-pixel structure in the light-emitting aspect are illustrated hereinafter.

For example, as shown in FIG. 4, the target light-transmitting region A in the second function layer 02 is a colorless and transparent region, and the light-adjusting region W is capable of reflecting any incident light from the target light-transmitting region A. Optionally, in a case that the light-adjusting region W is a region where the insulating block 012 is disposed, a material of the insulating block 012 may be metal, such as silver, aluminum, or the like. Optionally, when a certain region is the colorless and transparent region, the region allows light having various wavelengths to pass through, and the light-adjusting region W is capable of reflecting the light having various wavelengths. In this way, a color of light emitted by the sub-pixel structure is as same as a color of the incident light in the sub-pixel structure.

For example, when the incident light in the sub-pixel structure from a side, where the second functional layer 02 in the sub-pixel structure is located, is white light, the emitted light from a side, where the second functional layer 02 in the sub-pixel structure is disposed, is also white light; and when the incident light in the sub-pixel structure from a side, where the second functional layer 02 in the sub-pixel structure is disposed, is colored light, the emitted light from the side, where the second functional layer 02 in the sub-pixel structure is disposed, is also colored light. Therefore, the display panel where the sub-pixel structure is disposed has a paper-like display effect and may be called electronic paper.

Or the target light-transmitting region A in the second functional layer 02 is the colorless and transparent region, and the light-adjusting region W is capable of reflecting incident light having a specific wavelength from the target light-transmitting region A, and can absorb or transmit light having other wavelengths.

For example, incident light from the target light-transmitting region A is white light, and the light-adjusting region W is capable of reflecting light having some wavelengths in the white light, and can absorb or transmit the light with other wavelengths. Optionally, when the light-adjusting region W is a region where the insulating block 012 is disposed, a material of the insulating block 012 is a material obtained by doping a plurality of materials according to a certain ratio, and the plurality of materials may include an organic material, a ceramic material, a metal oxide material, or the like. For example, the material of the insulating block 012 is a zinc oxide material doped with magnesium. Optionally, when a certain region is the colorless and transparent region, the region allows light having various wavelengths to pass through, and the light-adjusting region W can screen light having specific wavelength from the incident light and reflect the light, and can absorb or transmit light having other wavelengths except the light having the specific wavelength. In this way, light emitted by the sub-pixel structure may be colored light, thereby realizing the color display of the display panel where the sub-pixel structure is disposed.

Or the target light-transmitting region A in the second functional layer 02 is the colorless and transparent region, and the light-adjusting region W is of a grating structure or a photonic crystal structure. Both the grating structure and the photonic crystal structure can convert incident light from the target light-transmitting region into light having a specific wavelength and emit the light having the specific wavelength to the target light-transmitting region, such that light emitted by the sub-pixel structure may be colored light and color display of the display panel where the sub-pixel structure is disposed may be achieved.

Or a material of a part, disposed in the target light-transmitting region A, of the second functional layer 02 is a color-filtering material (equivalently, the target light-transmitting region A is a color-filtering region), and the light-adjusting region W is capable of reflecting all or part of incident light from the target light-transmitting region A. Optionally, when the light-adjusting region W is a region where the insulating block 012 is disposed, a material of the insulating block 012 be metal, such as silver, aluminum, or the like. Optionally, that the color-filtering material only allows the colored light having the specific wavelength to pass through, and the light-adjusting region W is capable of reflecting all the incident light. Therefore, the light incident to the sub-pixel structure from the target light-transmitting region A is colored light and light obtained by reflection of the insulating block 012 is also colored light, such that the light emitted by the sub-pixel structure is the colored light and the color display of the display panel is achieved where the sub-pixel structure is disposed.

Or the light-adjusting region W in FIG. 1 to FIG. 4 may also not be reflective, but can be photoluminescent. For example, when the light-adjusting region W is a region where the insulating block 012 is disposed, a material of the insulating block 012 is a photoluminescent material. At this time, the light-adjusting region W can convert the incident light into light having a set of specific wavelength and emit the light. For example, the incident light from the target light-transmitting region is white light, and the light-adjusting region W can convert the white light into red light, green light or blue light and emit the light to the target light-transmitting region. Optionally, when the light-adjusting region W is photoluminescent, the target light-transmitting region A can be the colorless and transparent region or the color-filtering region, which is not limited in the embodiment of the present disclosure. Light emitted by the sub-pixel structure may be the light in the specific wavelength range. When the light in the specific wavelength range is colored light, color display of the display panel where the sub-pixel structure is disposed may be achieved.

Optionally, when a certain region in a certain functional layer is the colorless and transparent region, the region in the functional layer may be a hollowed-out region, or a material of the region in the functional layer is a colorless and transparent material, which is not limited in the embodiment of the present disclosure.

The sub-pixel structure according to the embodiment of the present disclosure may be disposed between the first substrate and the second substrate. For example, when the sub-pixel structure shown in FIG. 4 is manufactured, the first drive electrode and the second drive electrode may be firstly formed on the first substrate, then the first functional layer is formed on the first drive electrode and the second drive electrode, and the first switch electrode and the second switch electrode are formed on the first functional layer. Further, the conductive structure may further be formed on the first substrate on which the first drive electrode, the second drive electrode, the first functional layer, the first switch electrode and the second switch electrode are formed, such that the conductive structure is disposed between the first switch electrode and the second switch electrode. Then, the second functional layer may further be formed on the second substrate, the second functional layer may be made of a light-shielding material, and the target light-shielding region in the second functional layer may be a hollowed-out region. Finally, the first substrate and the second substrate are arranged oppositely such that the first conductive pattern, the second functional layer, the second conductive pattern, the conductive structure, and the first functional layer are all between the first substrate and the second substrate.

The sub-pixel structure according to the embodiment of the present disclosure further has other implementations different from the above implementation. Two other implementations of the sub-pixel structure are illustrated hereinafter.

Figure 5:
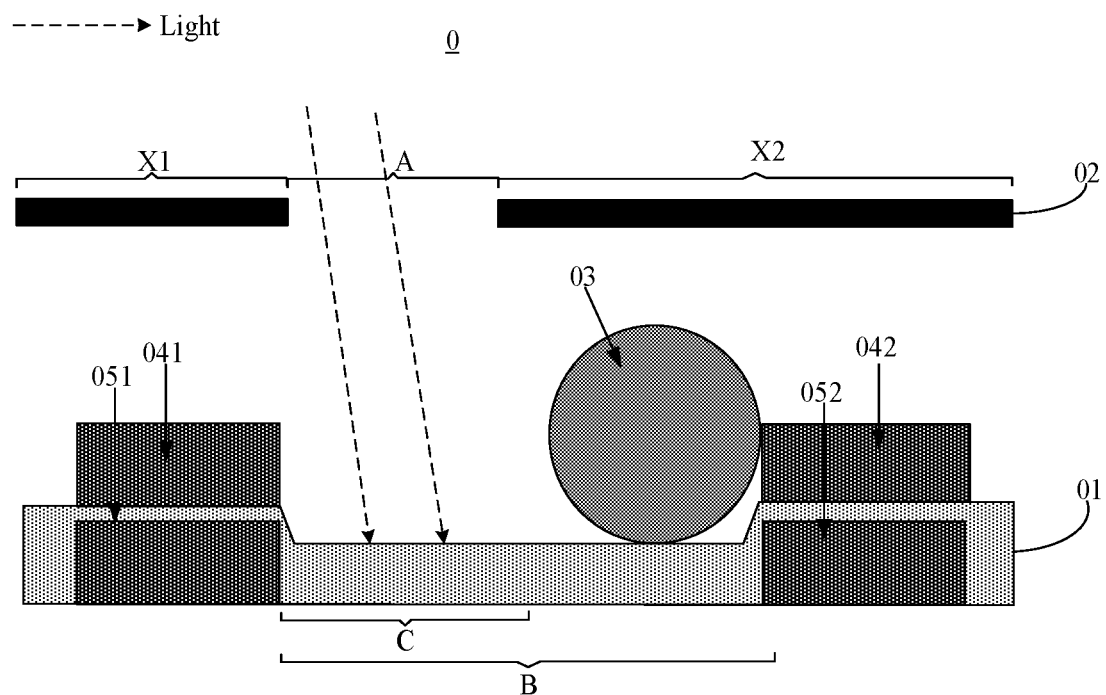
FIG. 5 is a schematic diagram of another sub-pixel structure according to an embodiment of the present disclosure.

In the first other implementation, as shown in FIG. 5, on the basis of the sub-pixel structure shown in any one of FIGS. 1-4 (FIG. 5 is taken as an example based on FIG. 4), the first functional layer may also not include the light-adjusting region, and the conductive structure 03 may be reflective. Referring to FIG. 5, a surface, facing the second functional layer 02, of the first functional layer 01 is provided with an auxiliary light-shielding region C disposed in the insulating region B, and the orthographic projection of the target light-transmitting region A on the first functional layer 01 is within the auxiliary light-shielding region C.

Optionally, the auxiliary light-shielding region C may be obtained in various fashions. For example, a material of the entire first functional layer 01 is a light-shield material, such that the auxiliary light-shielding region C can shield light. Or the first functional layer 01 includes a functional layer body and an insulating block disposed on a side, proximal to the second functional layer 02, of the functional layer body, and a region where the insulating block is disposed is the auxiliary light-shielding region. Or a material of a part, disposed in the auxiliary light-shielding region, of the first functional layer 01 is a light-shielding material, and a material of other part except the auxiliary light-shielding region C is not a light-shielding material. The implementations of the auxiliary light-shielding region are not limited in the embodiment of the present disclosure.

As shown in FIG. 5, when it is necessary to control the sub-pixel structure 0 to achieve dark state display, the conductive structure 03 in the light-adjusting structure 03 may be controlled to move towards one electrode (such as a second switch electrode 042), distal from the target light-transmitting region A, of the plurality of electrodes, and the conductive structure 03 does not shield the target light-transmitting region A (that is, an orthographic projection of the conductive structure 03 on the second functional layer 02 is outside the target light-transmitting region A, and an orthographic projection of the conductive structure 03 on the first functional layer 01 is outside the orthographic projection of the target light-transmitting region A on the first functional layer 01). At this time, incident light from the target light-transmitting region A arrives at the auxiliary light-shielding region C in the first functional layer 01 and is absorbed by the auxiliary light-shielding region C, such that no light is emitted from the sub-pixel structure 0 at the target light-transmitting region A, and a side, where the second functional layer 02 is disposed, of the sub-pixel structure 0 achieves dark state display.

Figure 6:
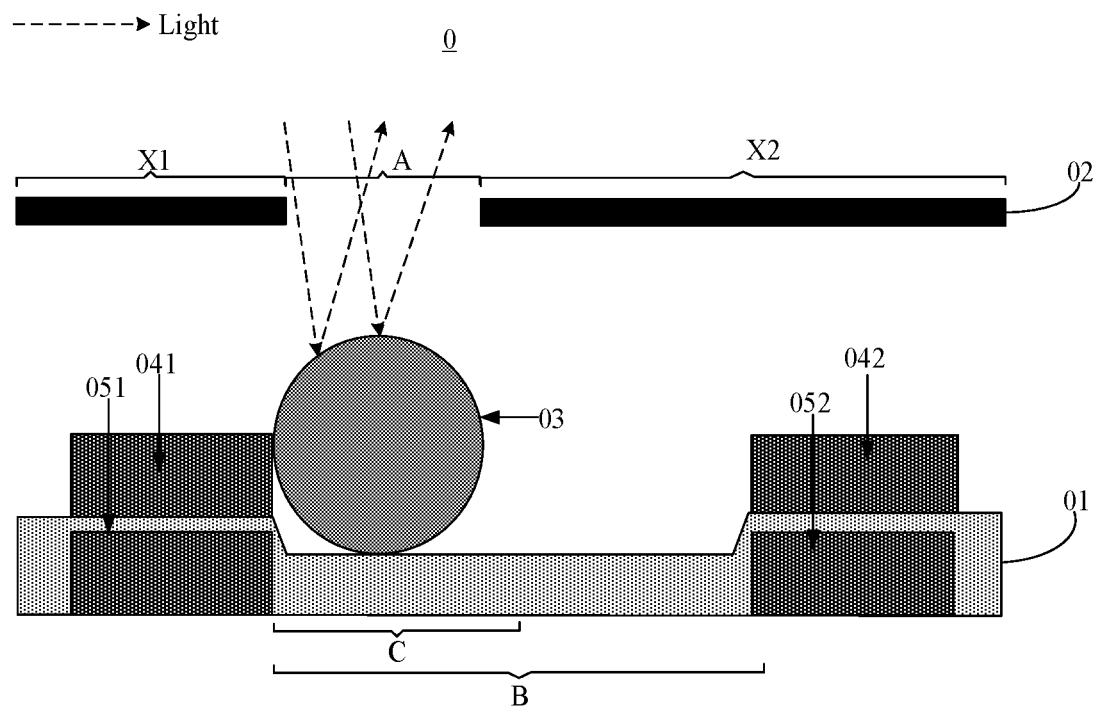
FIG. 6 is a schematic diagram of another sub-pixel structure according to an embodiment of the present disclosure.

When it is necessary to control the side, where the second functional layer 02 is disposed, of the sub-pixel structure 0 to achieve bright state display, as shown in FIG. 6, the conductive structure 03 in the light-adjusting structure 03 may be controlled to move towards one electrode (such as a first switch electrode 041), proximal to the target light-transmitting region, of the plurality of electrodes, and the conductive structure 03 completely shields the target light-transmitting region A (that is, the orthographic projection of the conductive structure 03 on the second functional layer 02 covers the target light-transmitting region A, and the orthographic projection of the target light-transmitting region A on the first functional layer 01 is within the orthographic projection of the conductive structure 03 on the first functional layer 01). At this time, incident light from the target light-transmitting region A can be reflected by the conductive structure 03 to the target light-transmitting region A and be emitted from the sub-pixel structure, such that the side, where the second functional layer 02 is disposed, of the sub-pixel structure achieves bright state display.

Figure 7:
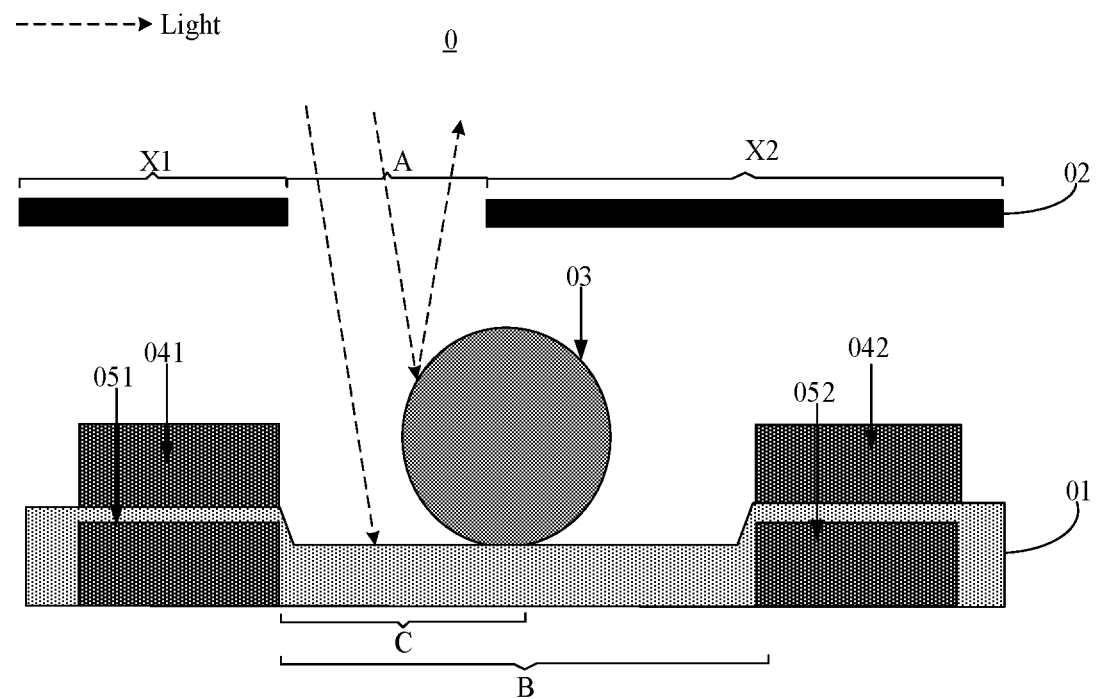
FIG. 7 is a schematic diagram of another sub-pixel structure according to an embodiment of the present disclosure.

When it is necessary to adjust the luminance of the side, where the second functional layer 02 is disposed, of the sub-pixel structure 0, as shown in FIG. 7, the conductive structure 03 may be controlled to move towards a region among the plurality of electrodes, thereby shielding a part of the target light-transmitting region A (that is, the orthographic projection of the conductive structure 03 on the second functional layer 02 partially overlaps the target light-transmitting region A, and the orthographic projection of the target light-transmitting region A on the first functional layer 01 partially overlaps the orthographic projection of the conductive structure 03 on the first functional layer 01). In this way, one part of incident light from the target light-transmitting region A is reflected on the conductive structure 03 and back to the target light-transmitting region A, and the other part of the light is not emitted to the conductive structure 03, but is directly emitted to the auxiliary light-shielding region C in the first functional layer 01 and is absorbed by the auxiliary light-shielding region C, thereby reducing light reflected by the conductive structure 03, reducing light emitted by the target light-transmitting region A and reducing the luminance of the side, where the second functional layer 02 is disposed, of the sub-pixel structure.

Optionally, the sub-pixel structure according to the embodiment of the present disclosure may emit light as same as ambient light, and may further emit light having a certain color of ambient light. Several possible implementations of the sub-pixel structure in the light-emitting aspect are illustrated hereinafter.

For example, the target light-transmitting region in the second function layer 02 is a colorless and transparent region, and the conductive structure 03 is capable of reflecting any incident light from the target light-transmitting region. At this time, a color of the light emitted by the conductive structure 03 is as same as a color of light incident to the sub-pixel structure. Optionally, a material of the conductive structure 03 may be metal, such as silver, aluminum, or the like. Optionally, when a certain region is a colorless and transparent region, the region allows light having various wavelengths to pass through, and the auxiliary light-shielding region is capable of reflecting the light having various wavelengths. In this way, the display panel where the sub-pixel structure is disposed has a paper-like display effect and may be called electronic paper.

Or the target light-transmitting region in the second functional layer 02 is the colorless and transparent region. For example, the incident light from the target light-transmitting region is white light, and the conductive structure 03 is capable of reflecting light having a specific wavelength in the white light, and absorb or transmit light having other wavelengths. Optionally, a material of the conductive structure 03 is a material obtained by doping a plurality of materials according to a certain ratio, and the plurality of materials may include an organic material, a ceramic material and a metal oxide material, or the like. For example, the material of the conductive structure 03 is a zinc oxide material doped with magnesium. When a certain region is the colorless and transparent region, the region allows light having various wavelengths to pass through, and the conductive structure 03 can screen light having a specific wavelength from the incident light and reflect it, and can absorb or transmit light having other wavelengths except the light having the specific wavelength. In this way, light emitted by the sub-pixel structure may be colored light, thereby realizing the color display of the display panel where the sub-pixel structure is disposed.

Or the target light-transmitting region in the second functional layer 02 is the colorless and transparent region, and a surface of the conductive structure 03 is of a grating structure or a photonic crystal structure. Both the grating structure and the photonic crystal structure can convert incident light from the target light-transmitting region into light having a specific wavelength and emit the light having the specific wavelength to the target light-transmitting region, such that light emitted by the sub-pixel structure may be colored light and the color display of the display panel where the sub-pixel structure is disposed may be achieved.

Or a material of a part, disposed in the target light-transmitting region, of the second functional layer 02 is a color-filtering material (the target light-transmitting region is a color-filtering region), and the conductive structure 03 is capable of reflecting part or all of light incident from the target light-transmitting region. At this time, a color of the light emitted by the conductive structure 03 belongs to a color of the light incident to the sub-pixel structure. Optionally, a material of the conductive structure 03 is metal, such as silver, aluminum, or the like. Optionally, the color-filtering material only allows the colored light having the specific wavelength to pass through, and the conductive structure 03 is capable of reflecting all the incident light. Therefore, the incident light in the sub-pixel structure from the target light-transmitting region is colored light and light obtained by reflection of the conductive structure 03 is also the colored light, such that enabling the light emitted by the sub-pixel structure is the colored light and the color display of the display panel is achieved where the sub-pixel structure is disposed.

Optionally, the conductive structure 03 in FIG. 5 to FIG. 7 may also not be reflective, but can be photoluminescent. The conductive structure 03 can convert the incident light into light having a set of specific wavelength and emit it. For example, the incident light from the target light-transmitting region is white light, and the conductive structure 03 can convert the white light into red light, green light or blue light and emit it to the target light-transmitting region. Optionally, a material of the conductive structure 03 is a photoluminescent material. Optionally, when a certain region is a colorless and transparent region and the region allows light having various wavelengths to pass through. The conductive structure 03 can convert the incident light into light having a specific wavelength and emit it to the target light-transmitting region, and thus light emitted by the sub-pixel structure may be the light in the specific wavelength range. When the light in the specific wavelength range is colored light, the color display of the display panel where the sub-pixel structure is disposed can be achieved.

The sub-pixel structure according to the embodiment of the present disclosure may be disposed between the first substrate and the second substrate. For example, when the sub-pixel structure shown in FIG. 5 is manufactured, the first drive electrode and the second drive electrode may be firstly formed on the first substrate, then the first functional layer is formed on the first drive electrode and the second drive electrode, and the first switch electrode and the second switch electrode are formed on the first functional layer. Further, the conductive structure may further be placed on the first substrate on which the first drive electrode, the second drive electrode, the first functional layer, the first switch electrode and the second switch electrode are formed, such that the conductive structure is disposed between the first switch electrode and the second switch electrode. Then, the second functional layer may further be formed on the second substrate, and both the first functional layer and the second functional layer may be made of a light-shielding material. Finally, the first substrate and the second substrate are arranged oppositely such that all the first conductive pattern, the second functional layer, the second conductive pattern, the conductive structure, and the first functional layer are between the first substrate and the second substrate.

Figure 8:
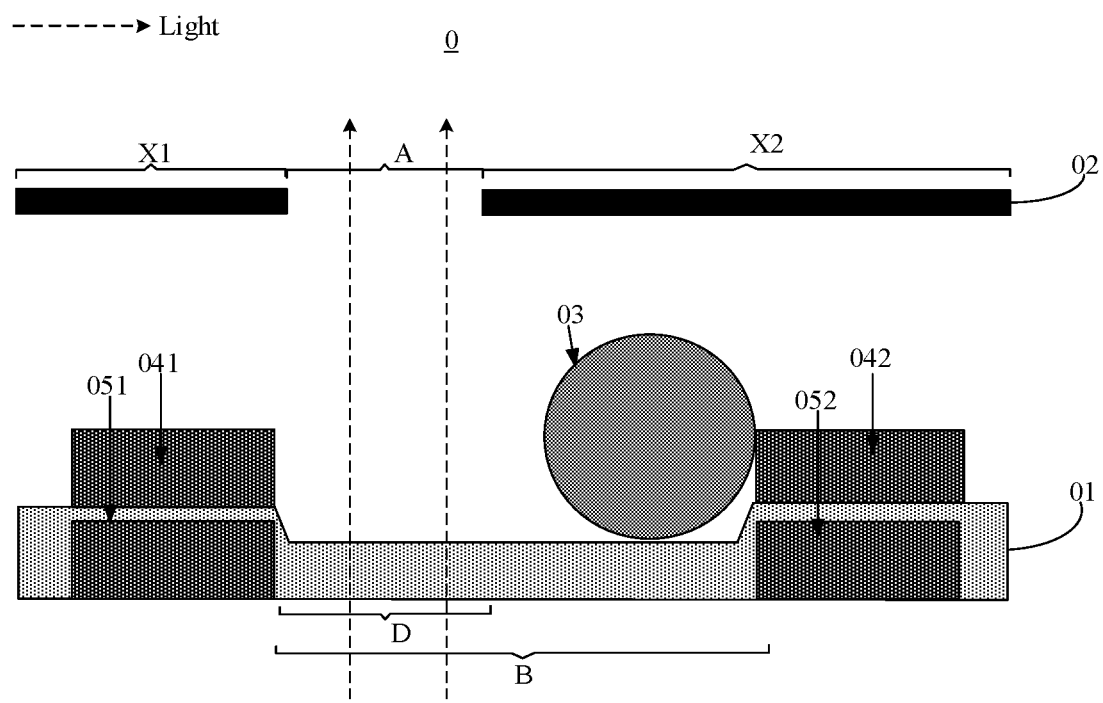
FIG. 8 is a schematic diagram of another sub-pixel structure according to an embodiment of the present disclosure.

In the second other implementation, as shown in FIG. 8, on the basis of the sub-pixel structure shown in any one of FIGS. 1-4 (FIG. 8 is taken as an example based on FIG. 4), the first functional layer may also not include the light-adjusting region. Referring to FIG. 8, the first functional layer 01 is provided with an auxiliary light-shielding region D, and the orthographic projection of the auxiliary light-shielding region D on the second functional layer 02 covers the target light-transmitting region A (the orthographic projection of the target light-transmitting region A on the first functional layer 01 is within the auxiliary light-shielding region D). The conductive structure 03 is light-shielding.

As shown in FIG. 8, when it is necessary to control the sub-pixel structure 0 to achieves bright state display, the conductive structure 03 in the light-adjusting structure 03 may be controlled to move towards one electrode (such as a second switch electrode 042), distal from the target light-transmitting region A, of the plurality of electrodes, and the conductive structure 03 does not shield the target light-transmitting region A (that is, an orthographic projection of the conductive structure 03 on the second functional layer 02 is outside the target light-transmitting region A, and an orthographic projection of the target light-transmitting region A on the first functional layer 01 is within the orthographic projection of the conductive structure 03 on the first functional layer 01). At this time, light on a side, distal from the second functional layer 02, f the first functional layer 01 can be emitted into the sub-pixel structure from the auxiliary light-transmitting region D in the first functional layer 01. Furthermore, the conductive structure 03 does not shield the target light-transmitting region A at this time, and an orthographic projection of the auxiliary light-transmitting region D on the second functional layer 02 covers the target light-transmitting region A (an orthographic projection of the target light-transmitting region A on the first functional layer 01 is within the auxiliary light-transmitting region D); therefore, light incident from the auxiliary light-transmitting region D can be directly emitted into the target light-transmitting region A and be emitted out to a side, distal from the first functional layer 01, of the second functional layer 02 from the target light-transmitting region A, such that enabling the side, where the second functional layer 02 is disposed, of the sub-pixel structure 0 to achieves bright state display.

Figure 9:
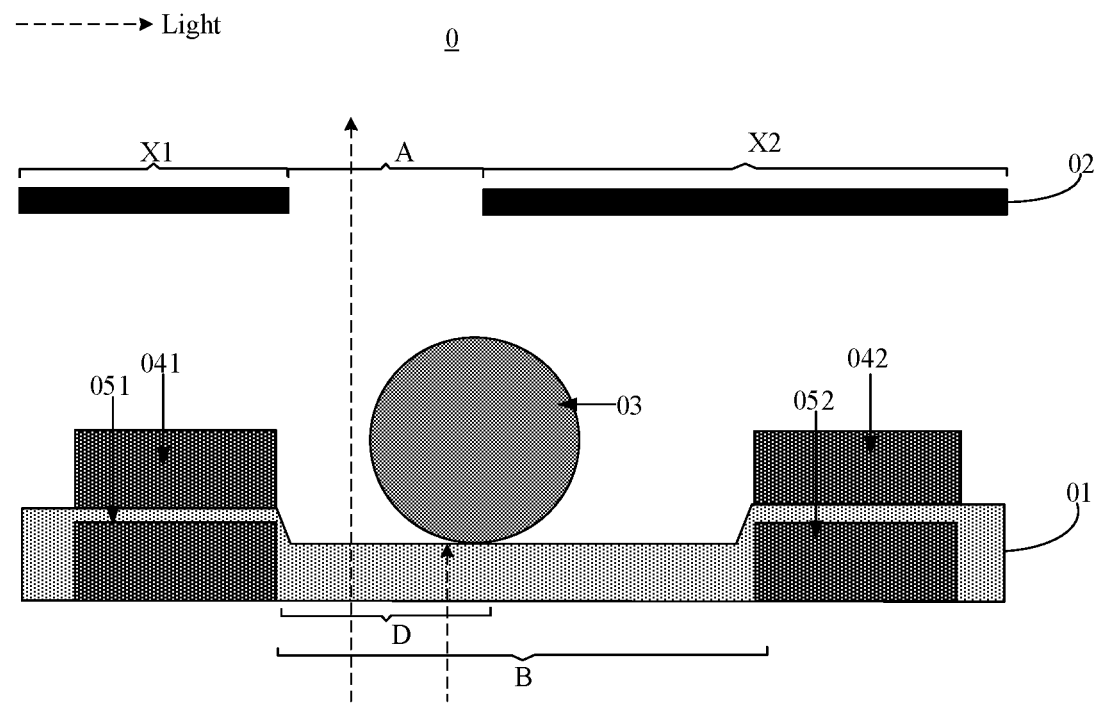
FIG. 9 is a schematic diagram of another sub-pixel structure according to an embodiment of the present disclosure.

Further, when it is necessary to adjust the luminance of the side, where the second functional layer 02 is disposed, of the sub-pixel structure 0, as shown in FIG. 9, the conductive structure 03 may be controlled to move towards a region among the plurality of electrodes, thereby shielding a part of the target light-transmitting region A (that is, the orthographic projection of the conductive structure 03 on the second functional layer 02 partially overlaps the target light-transmitting region A, and the orthographic projection of the conductive structure 03 on the first functional layer 01 partially overlaps the orthographic projection of the target light-transmitting region A on the first functional layer 01). In this way, one part of incident light from the auxiliary light-transmitting region D is emitted into the conductive structure 03 and is absorbed by the conductive structure, and the other part of light is not emitted to the conductive structure 03 but is directly emitted to the target light-transmitting region A in the second functional layer 02, thereby reducing light emitted from the target light-transmitting region A and reducing the luminance of the side, where the second functional layer 02 is disposed, of the sub-pixel structure.

Figure 10:
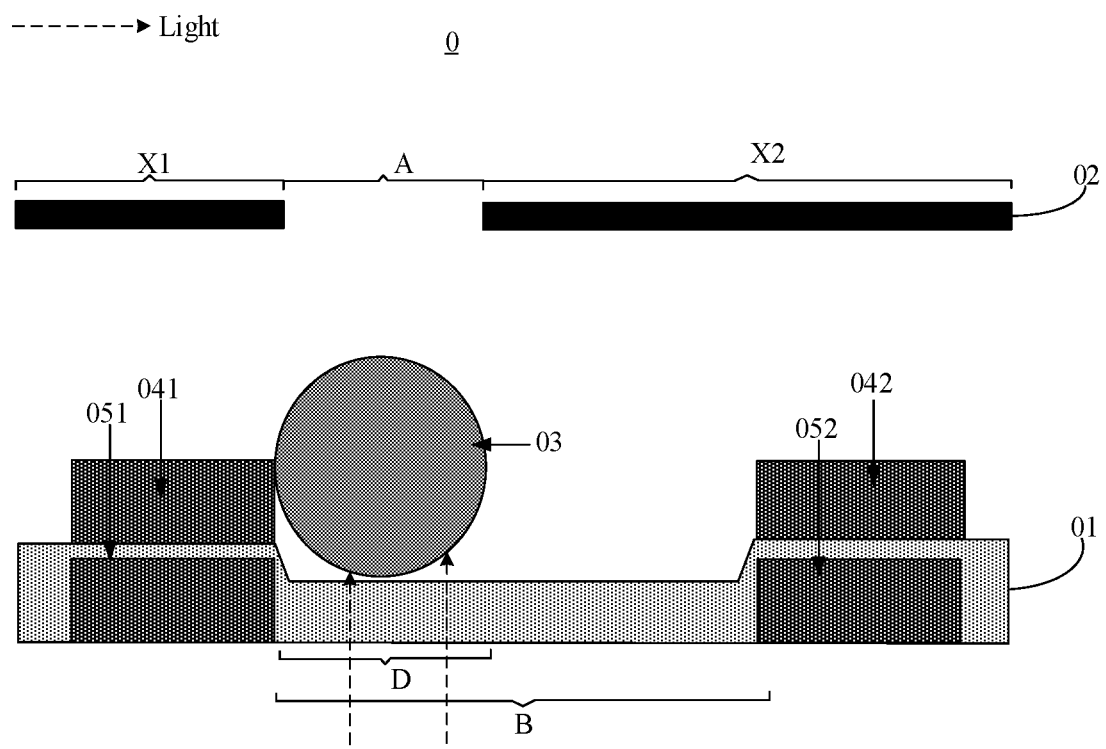
FIG. 10 is a schematic diagram of another sub-pixel structure according to an embodiment of the present disclosure.

When it is necessary to control the side, where the second functional layer 02 is disposed, of the sub-pixel structure 0 to achieves dark state display, as shown in FIG. 10, the conductive structure 03 in the light-adjusting structure 03 may be controlled to move towards one electrode (such as a first switch electrode 041), proximal to the target light-transmitting region, of the plurality of electrodes, and the conductive structure 03 completely shields the target light-transmitting region A (that is, the orthographic projection of the conductive structure 03 on the second functional layer 02 covers the target light-transmitting region A, and the orthographic projection of the target light-transmitting region A on the first functional layer 01 is within the orthographic projection of the conductive structure 03 on the first functional layer 01). At this time, incident light from the auxiliary light-transmitting region D is absorbed by the conductive structure 03, and no light is emitted into the target light-transmitting region A, such that the side, where the second functional layer 02 is disposed, of the sub-pixel structure achieves dark state display.

Optionally, the sub-pixel structure according to the embodiment of the present disclosure may emit light as same as ambient light, and may further emit light having a certain color of ambient light. Several possible implementations of the sub-pixel structure in the light-emitting aspect are illustrated hereinafter.

For example, the target light-transmitting region A in the second functional layer 02 is a colorless and transparent region, and the auxiliary light-transmitting region D in the first functional layer 01 is a colorless and transparent region. At this time, a color of incident light from a side, distal from the second functional layer 02, of the first functional layer 01 may be as same as a color of light emitted from the side, distal from the first functional layer 01, of the second functional layer 02, and both of them are as same as a color of ambient light (such as white light). Therefore, the display panel where the sub-pixel structure is disposed has a paper-like display effect and may be called electronic paper.

Optionally, the target light-transmitting region A is a color-filtering region and the auxiliary light-transmitting region D is a colorless and transparent region. For example, a material of a part, disposed in the target light-transmitting region A, of the second functional layer 02 is a color-filtering material, and the auxiliary light-transmitting region D in the first functional layer 01 is colorless and transparent. In this way, the light emitted into the sub-pixel structure from the auxiliary light-transmitting region D of the first functional layer 01 is as same as ambient light, but the light emitted out of the sub-pixel structure from the target light-transmitting region A of the second functional layer 02 is the light having a certain color of the ambient light, thereby realizing the color display of the display panel where the sub-pixel structure is disposed.

Optionally, the target light-transmitting region A is a colorless and transparent region and the auxiliary light-transmitting region D is a color-filtering region. For example, the target light-transmitting region A of the second functional layer 02 is colorless and transparent, and a material of a part, disposed in the auxiliary light-transmitting region D, of the first functional layer 01 is a color-filtering material. In this way, the light emitted into the sub-pixel structure from the auxiliary light-transmitting region D of the first functional layer 01 is a certain colored light of the ambient light, and the light emitted out of the sub-pixel structure from the target light-transmitting region A of the second functional layer 02 is also the colored light, thereby realizing the color display of the display panel where the sub-pixel structure is disposed.

Optionally, both the target light-transmitting region A and the auxiliary light-transmitting region D are color-filtering regions, and a wavelength set of light which the target light-transmitting region A allows to pass through and a wavelength set of light which the auxiliary light-transmitting region D allows to pass through have an intersection. In this way, the light emitted into the sub-pixel structure from the auxiliary light-transmitting region D of the first functional layer 01 includes a certain colored light of the ambient light, and the light emitted out of the sub-pixel structure from the target light-transmitting region A of the second functional layer 02 also includes the color, thereby realizing the color display of the display panel where the sub-pixel structure is disposed.

The sub-pixel structure according to the embodiment of the present disclosure may be disposed between the first substrate and the second substrate. For example, when the sub-pixel structure shown in FIG. 8 is manufactured, the first drive electrode and the second drive electrode may be firstly formed on the first substrate, then the first functional layer is formed on the first drive electrode and the second drive electrode, and the first switch electrode and the second switch electrode are formed on the first functional layer. Further, the conductive structure may further be placed on the first substrate on which the first drive electrode, the second drive electrode, the first functional layer, the first switch electrode and the second switch electrode are formed, such that the conductive structure is disposed between the first switch electrode and the second switch electrode. Then, the second functional layer may further be formed on the second substrate, the first functional layer is made of a transparent material, and the second functional layer is made of a light-shielding material. Finally, the first substrate and the second substrate are disposed oppositely such that all the first conductive pattern, the second functional layer, the second conductive pattern, the conductive structure, and the first functional layer are between the first substrate and the second substrate.

Optionally, the sub-pixel structure according to the embodiment of the present disclosure may include one conductive structure or a plurality of conductive structures. FIGS. 1-10 only take the sub-pixel structure includes one conductive structure as an example. The number of the conductive structure included in the sub-pixel structure is not limited in the embodiment of the present disclosure. When the sub-pixel structure includes a plurality of conductive structures, the plurality of conductive structures can gather under the action of the electrodes of the sub-pixel structure. When the plurality of gathered conductive structures are at the first position, the orthographic projections of the plurality of conductive structures on the second functional layer cover the target light-transmitting region (the orthographic projection of the target light-transmitting region A on the first functional layer 01 is within the orthographic projections of the plurality of conductive structures on the first functional layer 01). When the plurality of gathered conductive structures are at the second position, the orthographic projections of the plurality of conductive structures on the second functional layer are outside the target light-transmitting region (the orthographic projection of the target light-transmitting region A on the first functional layer 01 is outside the orthographic projections of the plurality of conductive structures on the first functional layer 01).

In conclusion, in the sub-pixel structure according to the embodiment of the present disclosure, the light-adjusting structure can change a light emission area of the target light-transmitting region through movement of the conductive structure under the action of the electrode, thereby changing a luminance of the sub-pixel structure and realizing a bright state or a dark state of the sub-pixel structure. Furthermore, due to the mature manufacturing process of the conductive structure and the electrode, the conductive structure and the electrode with small size can be generally manufactured, and thus the sub-pixel structure with small size can be manufactured, the density of pixels of the display panel where the sub-pixel structure is disposed is larger, and the display effect of the display panel is improved.

Figure 11:
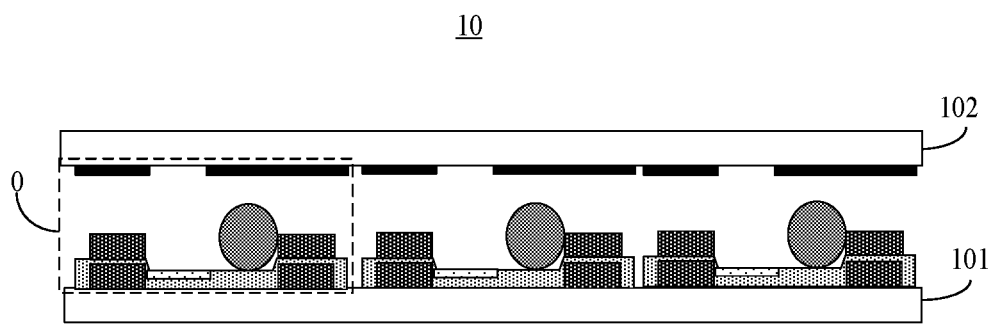
FIG. 11 is a schematic structural diagram of a display panel according to an embodiment of the present disclosure.

FIG. 11 is a schematic structural diagram of a display panel according to an embodiment of the present disclosure. As shown in FIG. 11, the display panel 10 may include: a first substrate 101 and a second substrate 102 which are arranged oppositely, and a plurality of sub-pixel structures 0 disposed between the first substrate 101 and the second substrate 102 and arranged in an array. For example, each sub-pixel structure 0 of the plurality of sub-pixel structures 0 may be the sub-pixel structure shown in any one of FIGS. 1-10. In FIG. 11, the case where the sub-pixel structure in the display panel is the sub-pixel structure shown in FIG. 4 is taken as an example.

Optionally, the first functional layers of the plurality of sub-pixel structures may be mutually independent or be connected into an entire layer structure; and the second functional layers of the plurality of sub-pixel structures may be mutually independent or be connected into an entire layer structure, which are not limited in the embodiment of the present disclosure. In FIG. 11, that the first functional layers of the plurality of sub-pixel structures may be mutually independent and the second functional layers of plurality of sub-pixel structures may be mutually independent is taken as an example.

In conclusion, in the display panel according to the embodiment of the present disclosure, the conductive structure can move under the action of a plurality of electrodes to change a light emission area of the target light-transmitting region, thereby changing a luminance of the sub-pixel structure and realizing a bright state or a dark state of the sub-pixel structure. Due to the mature manufacturing process of the conductive structure and the electrode, the conductive structure and the electrode with small size can be generally manufactured, and thus the sub-pixel structure with small size can be manufactured, the density of pixels of the display panel where the sub-pixel structure is disposed is larger, and the display effect of the display panel is improved.

Furthermore, the sub-pixel structures may be uniformly distributed, such that the display effects of all regions of the display panel are consistent and the display effect of the display panel is improved. Since the sub-pixel structure adjusts a light emission quantity of the target light-transmitting region by the movement of the conductive structure, the sub-pixel structure may adjust the light emission quantity without a polarizer, such that a high light utilization ratio of the display panel is achieved.

Figure 12:
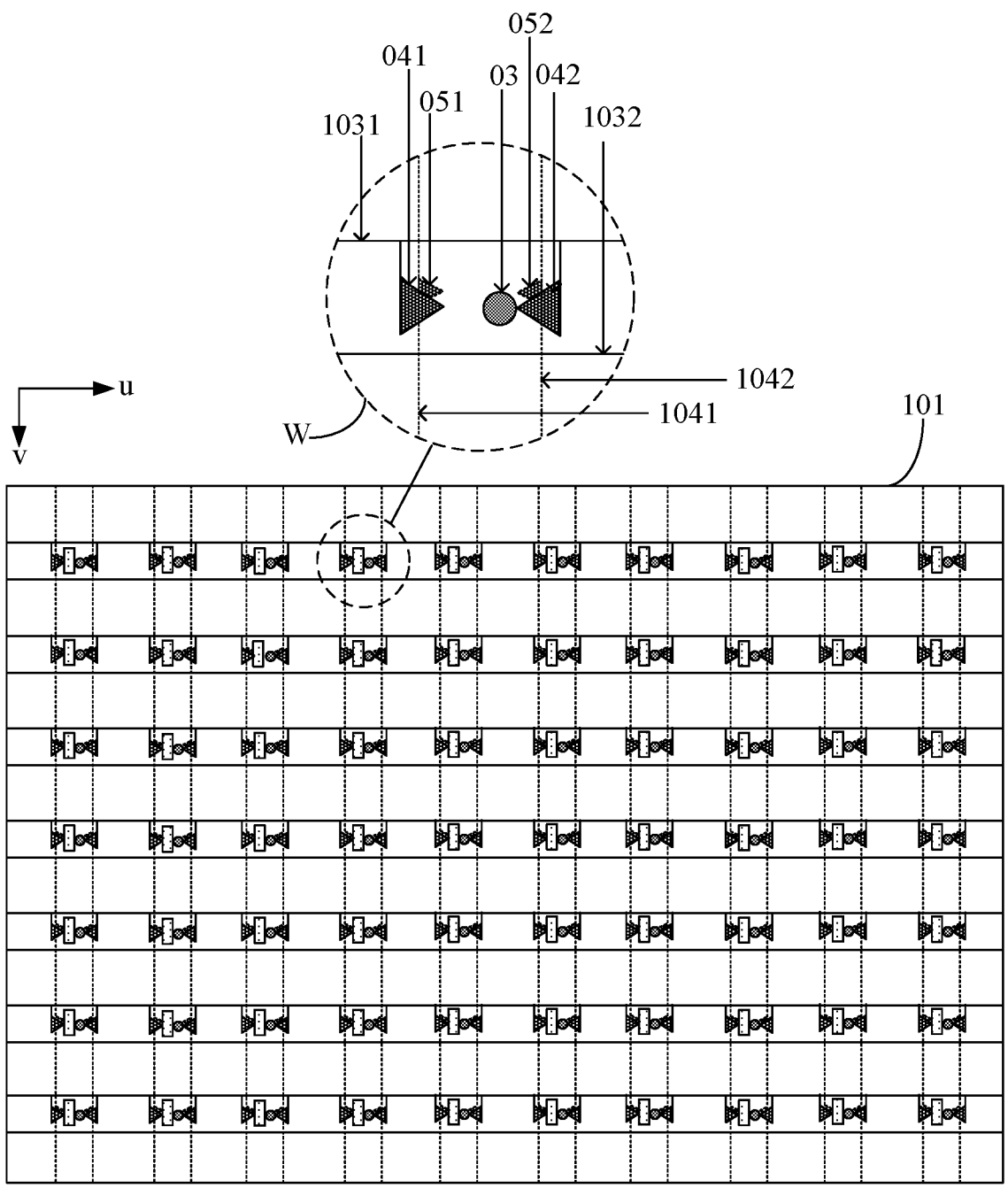
FIG. 12 is a schematic diagram of distribution of a structure formed on a first substrate according to an embodiment of the present disclosure.

Optionally, the first functional layer 01 of each of the sub-pixel structures of the plurality of sub-pixel structures may be disposed on a surface, proximal to the second substrate 102, of the first substrate 101, and the second functional layer 02 of each of the sub-pixel structures is disposed on a surface, proximal to the first substrate 101, of the second substrate 102. FIG. 12 is a schematic diagram of distribution of a structure formed on a first substrate according to an embodiment of the present disclosure. FIG. 12 only schematically shows structures formed on the first substrate. Shapes of the structures in FIG. 12 are not limited in the embodiment of the present disclosure. As shown in FIG. 12, the plurality of sub-pixel structures 0 may be arranged in m rows and n columns on the first substrate 101 (in FIG. 12, the case where m=7 and n=10 is taken as an example; optionally, m and n may further be other numerical values, for example, m=100 and n=200, or the like), wherein m≥1 and n≥1. The display panel 10 may further include: m first switch signal lines 1031, m second switch signal lines 1032, n first drive signal lines 1041 and n second drive signal lines 1042 which are disposed on the first substrate 101 (may not be disposed on the first substrate) and are mutually insulated.

Electrodes of each of the sub-pixel structures 0 may include: a first switch electrode 041, a second switch electrode 042, a first drive electrode 051 and a second drive electrode 052. For the sub-pixel structure in the $i^{th}$ row and the $j^{th}$ column of the m rows and n columns of sub-pixel structures, the first switch electrode 041 is connected to the $i^{th}$ first switch signal line 1031, the second switch electrode 042 is connected to the $i^{th}$ second switch signal line 1032, the first drive electrode 051 is connected to the $j^{th}$ first drive signal line 1041, and the second drive electrode 052 is connected to the $j^{th}$ second drive signal line 1042, wherein $1 \le i \le m$ and $1 \le j \le n$.

In this way, m*n sub-pixel structures are connected by n first switch signal lines, n second switch signal lines, m first drive signal lines and m second drive signal lines, that is, 2n+2m signal lines in total. Therefore, more sub-pixel structures are connected by fewer signal lines, and the signal lines in the display panel are reduced.

Optionally, the first drive electrode 051, the second drive electrode 052, the first drive signal line 1041 and the second drive signal line 1042 may be disposed on the same layer. When the first drive electrode 051, the second drive electrode 052, the first drive signal line 1041 and the second drive signal line 1042 are formed, a first conductive material layer may be firstly formed on the first substrate and then the first conductive material layer is treated by a patterning process to change the first conductive material layer into a first conductive pattern. The first conductive pattern includes: the first drive electrode 051, the second drive electrode 052, the first drive signal line 1041 and the second drive signal line 1042.

Similarly, the first switch electrode 041, the second switch electrode 042, the first switch signal line 1031 and the second switch signal line 1032 may also be disposed on the same layer. When the first switch electrode 041, the second switch electrode 042, the first switch signal line 1031 and the second switch signal line 1032 are formed, a second conductive material layer may be firstly formed on the first substrate second then the second conductive material layer is treated by a patterning process to change the second conductive material layer into a second conductive pattern. The second conductive pattern includes: the first switch electrode 041, the second switch electrode 042, the first switch signal line 1031 and the second switch signal line 1032.

Optionally, still referring to FIG. 12, all the first switch signal lines 1031 and the second switch signal lines 1032 are parallel to a row arrangement direction u of the plurality of sub-pixel structures 0, and all the first drive signal lines 1041 and the second drive signal lines 1042 are parallel to a column arrangement direction v of the plurality of sub-pixel structures 0. At this time, mutually intersected signal lines exist among the first switch signal line 1031, the second switch signal line 1032, the first drive signal line 1041 and the second drive signal line 1042. The sub-pixel structure in the $i^{th}$ row and the $j^{th}$ column may be disposed between the $i^{th}$ first switch signal line and the $i^{th}$ second switch signal line, and disposed between the $j^{th}$ first drive signal line and the $j^{th}$ second drive signal line.

The display panel may further include an insulating layer. The first drive signal line 1041 and the second drive signal line 1042 are disposed between the first substrate and the insulating layer; the first switch signal line 1031 and the second switch signal line 1032 may be disposed on a side, distal from the first substrate, of the insulating layer; and the insulating layer and the first functional layer may be formed on the same layer.

Optionally, each of the sub-pixel structures is configured to emit colored light having one color. The plurality of sub-pixel structures 0 form a plurality of pixel structures; each pixel structure of the plurality of pixel structures includes at least two (such as two, three or four) sub-pixel structures 0; and light emitted by any two sub-pixel structures 0 of each pixel structure has different colors. For example, every three sub-pixel structures 0 form a pixel structure, and the three sub-pixel structures 0 include: a sub-pixel structure emitting red light, a sub-pixel structure emitting green light and a sub-pixel structure emitting blue light.

In conclusion, in the display panel manufactured by the method according to the embodiment of the present disclosure, the conductive structure can move under the action of a plurality of electrodes to change a light emission area of the target light-transmitting region, thereby changing a luminance of the sub-pixel structure and realizing a bright state or a dark state of the sub-pixel structure. Furthermore, due to the mature manufacturing process of the conductive structure and the electrode, the conductive structure and the electrode with small size can be generally manufactured, and thus the sub-pixel structure with small size can be manufactured, the density of pixels of the display panel where the sub-pixel structure is disposed is larger, and the display effect of the display panel is improved.

Figure 13:
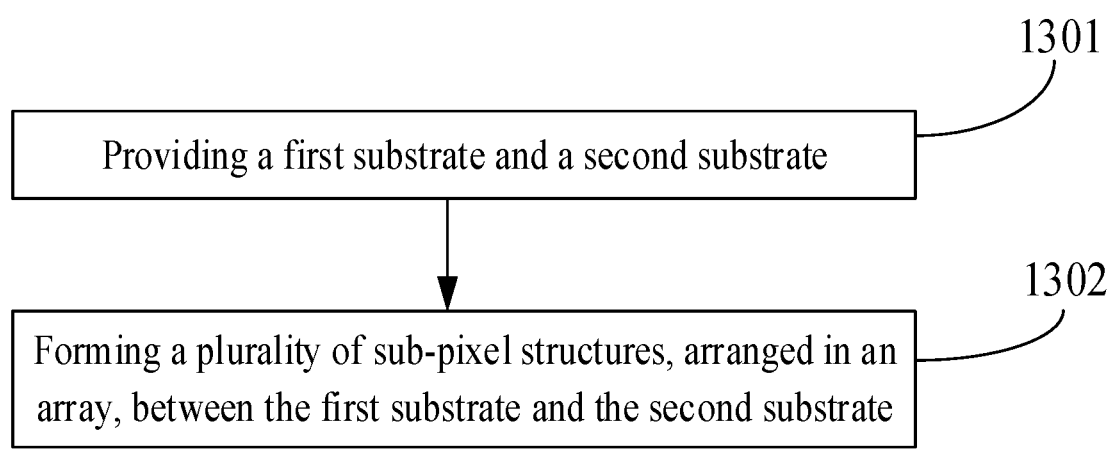
FIG. 13 is a flowchart of a method for manufacturing a display panel according to an embodiment of the present disclosure.

FIG. 13 is a flowchart of a method for manufacturing a display substrate according to an embodiment of the present disclosure, and the method is configured to manufacture the display panel as shown in FIG. 11. As shown in FIG. 13, the method includes the following steps:

In step 1301, a first substrate and a second substrate are provided.

In step 1302, a plurality of sub-pixel structures arranged in an array are formed between the first substrate and the second substrate.

The sub-pixel structure is the sub-pixel structure shown in any one of FIGS. 1-10.

In conclusion, in the display panel manufactured by the method according to the embodiment of the present disclosure, the conductive structure can move under the action of a plurality of electrodes to change a light emission area of the target light-transmitting region, thereby changing a luminance of the sub-pixel structure and realizing a bright state or a dark state of the sub-pixel structure. Furthermore, due to the mature manufacturing process of the conductive structure and the electrode, the conductive structure and the electrode with small size can be generally manufactured, and thus the sub-pixel structure with small size can be manufactured, the density of pixels of the display panel where the sub-pixel structure is disposed is larger, and the display effect of the display panel is improved.

Figure 14:
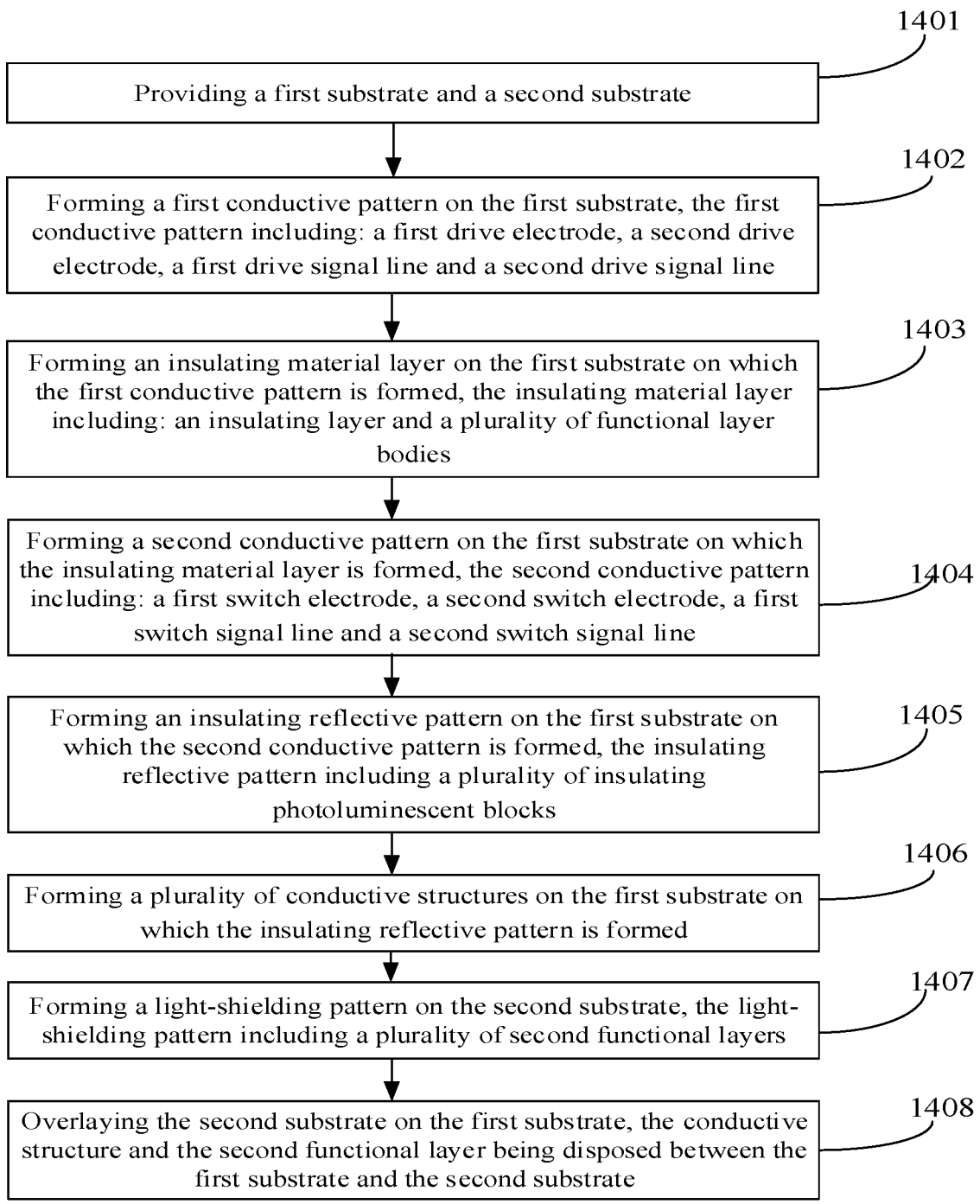
FIG. 14 is a flowchart of another method for manufacturing a display panel according to an embodiment of the present disclosure.

FIG. 14 is a flowchart of another method for manufacturing a display panel according to an embodiment of the present disclosure and the method is configured to manufacture the display panel as shown in FIG. 12. In FIG. 12, the case where the sub-pixel structure in the display panel is the sub-pixel structure shown in FIG. 4 is taken as an example. As shown in FIG. 14, the method may include:

In step 1401, a first substrate and a second substrate are provided.

Optionally, both the first substrate and the second substrate may be glass substrates or other transparent substrates, which is not limited in the embodiment of the present disclosure.

In step 1402, a first conductive pattern is formed on the first substrate, wherein the first conductive pattern includes a first drive electrode, a second drive electrode, a first drive signal line and a second drive signal line.

Figure 15:
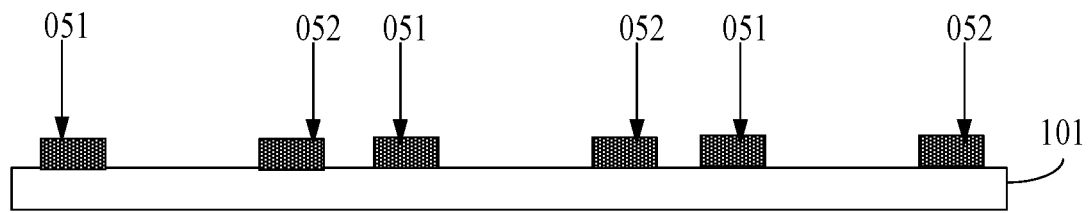
FIG. 15 is a schematic diagram of a manufacturing process of a display panel according to an embodiment of the present disclosure.

As shown in FIG. 15, a first conductive material layer may be firstly formed on the first substrate 101 and then the first conductive material layer is treated by a patterning process to obtain a plurality of first drive electrodes 051, a plurality of second drive electrodes 052, a plurality of first drive signal lines (not shown in FIG. 15) and a plurality of second drive signal lines (not shown in FIG. 15), thereby obtaining a first conductive pattern disposed on the first substrate 101.

The patterning process includes: photoresist coating, exposure, developing, etching and photoresist stripping. Therefore, treating the first conductive material layer by the patterning process includes: coating the first conductive material layer with one layer of photoresist, exposing the photoresist by a mask to form a complete exposure region and a non-exposure region by the patterning process, then performing treatment by a developing process to remove the photoresist in the complete exposure region and remain the photoresist in the non-exposure region, etching a region on the first conductive material layer corresponding to the complete exposure region, and stripping the photoresist in the non-exposure region to obtain a first conductive pattern, upon completion of etching.

In step 1403, an insulating material layer is formed on the first substrate on which the first conductive pattern is formed, wherein the insulating material layer includes an insulating layer and a plurality of functional layer bodies.

Figure 16:
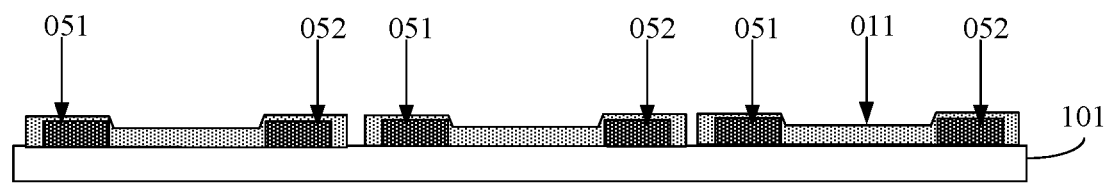
FIG. 16 is a schematic diagram of another manufacturing process of a display panel according to an embodiment of the present disclosure.

For example, as shown in FIG. 16, the insulating material layer may include a functional layer body 011 in each to-be-formed sub-pixel structure and an insulating layer (not shown in FIG. 16) for isolating a drive signal line and a switch signal line. The functional layer body 011 and the insulating layer may form an entire insulating material layer. The insulating layer covers the first drive signal line and the second drive signal line, and the functional layer body covers the first drive electrode and the second drive electrode.

In step 1404, a second conductive pattern is formed on the first substrate on which the insulating material layer is formed, wherein the second conductive pattern includes a first switch electrode, a second switch electrode, a first switch signal line and a second switch signal line.

Figure 17:
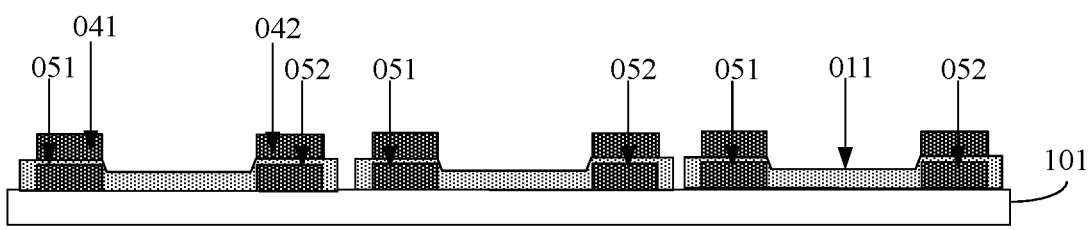
FIG. 17 is a schematic diagram of another manufacturing process of a display panel according to an embodiment of the present disclosure.

As shown in FIG. 17, a second conductive material layer may be formed on the first substrate 101 on which the insulating material layer is formed after the insulating material layer is formed, and then the second conductive material layer is treated by a patterning process to obtain a plurality of first switch electrodes 041, a plurality of second switch electrodes 042, a plurality of first switch signal lines (not shown in FIG. 17) and a plurality of second switch signal lines (not shown in FIG. 17), and thus obtain a second conductive pattern disposed on the first substrate 101.

In step 1405, an insulating reflective pattern is formed on the first substrate on which the second conductive pattern is formed, wherein the insulating reflective pattern includes a plurality of insulating blocks.

Figure 18:
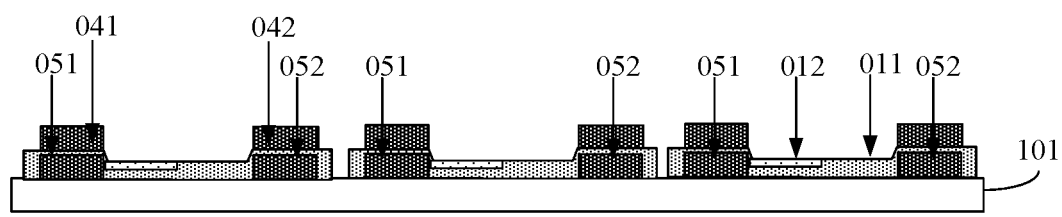
FIG. 18 is a schematic diagram of another manufacturing process of a display panel according to an embodiment of the present disclosure.

As shown in FIG. 18, an insulating reflective material layer may be formed on the first substrate 101 after the second conductive pattern is formed, and then the insulating reflective material layer is treated by a patterning process to obtain an insulating reflective pattern including a plurality of insulating blocks 012 (including a plurality of insulating blocks 012).

In step 1406, a plurality of conductive structures are formed on the first substrate on which the insulating reflective pattern is formed.

For example, before step 1406, a first drive electrode, a second drive electrode, a first switch electrode, a second switch electrode, and a first functional layer (including a functional layer body and an insulating block) in each of the sub-pixel structures have already been formed. Therefore, as shown in FIG. 19, in step 1406, a conductive structure 03 of the sub-pixel structure may be placed in a region of each of the to-be-formed sub-pixel structures, and the conductive structure 03 is disposed between the first switch electrode 041 and the second switch electrode 042 in the sub-pixel structure.

In step 1407, a light-shielding pattern is formed on the second substrate, wherein the light-shielding pattern includes a plurality of second functional layers.

As shown in FIG. 20, a light-shielding material layer may be formed on the second substrate 102 and then the light-shielding material layer is treated by a patterning process to obtain the light-shielding pattern of the plurality of second functional layers 02.

In step 1408, the second substrate is overlaid on the first substrate, and both the conductive structure and the second functional layer are between the first substrate and the second substrate.

After the second substrate is overlaid on the first substrate, the display panel 10 shown in FIG. 12 may be obtained. The display panel 10 includes the plurality of sub-pixel structures shown in FIG. 4.

In conclusion, in the display panel manufactured by the method according to the embodiment of the present disclosure, the conductive structure can move under the action of a plurality of electrodes to change a light emission area of the target light-transmitting region, thereby changing a luminance of the sub-pixel structure and realizing a bright state or a dark state of the sub-pixel structure. Furthermore, due to the mature manufacturing process of the conductive structure and the electrode, the conductive structure and the electrode with small size can be generally manufactured, and thus the sub-pixel structure with small size can be manufactured, the density of pixels of the display panel where the sub-pixel structure is disposed is larger, and the display effect of the display panel is improved.

FIG. 21 is a flowchart of a method for controlling a display panel according to an embodiment of the present disclosure. The display panel may be the display panel shown in FIG. 11 or FIG. 12. The method for controlling the display panel may be performed by a display controller. The display controller may be connected to the electrode of each of the sub-pixel structures of the display panel. As shown in FIG. 21, the method for controlling the display panel may include:

In step 2101, voltages loaded on the plurality of electrodes in the sub-pixel structure are adjusted such that the conductive structure in the sub-pixel structure moves in an insulating region of the sub-pixel structure.

Figure 22:
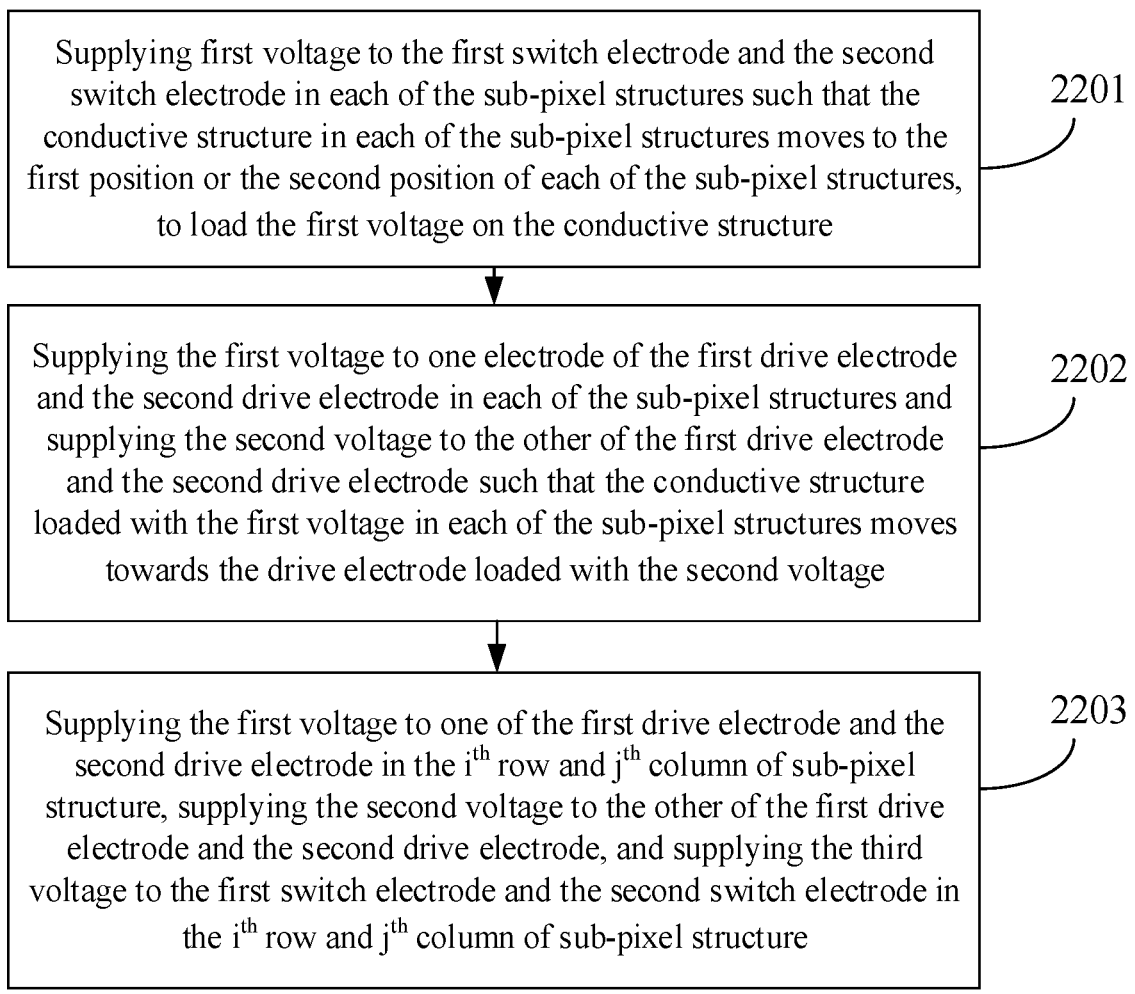
FIG. 22 is a flowchart of another method for controlling another display panel according to an embodiment of the present disclosure.

Optionally, FIG. 22 is a flowchart of another method for controlling a display panel according to an embodiment of the present disclosure, and the display panel may be the display panel shown in FIG. 12. As shown in FIG. 12, the electrode of each of the sub-pixel structures may include: a first switch electrode 041, a first drive electrode 051, a second switch electrode 042 and a second drive electrode 052. When the conductive structure 03 is disposed at a first position (a position of the conductive structure in FIG. 3) of the sub-pixel structure, the conductive structure 03 is electrically connected to the first switch electrode 041; and when the conductive structure 03 is disposed at a second position (a position of the conductive structure in FIG. 1) of the sub-pixel structure, the conductive structure 03 is electrically connected to the second switch electrode 042. As shown in FIG. 22, the method for controlling the display panel may include:

In step 2201, a first voltage is supplied to both the first switch electrode and the second switch electrode in each of the sub-pixel structures such that the conductive structure of each of the sub-pixel structures moves to the first position or the second position in each of the sub-pixel structures to load the first voltage to the conductive structure.

When the display controller adjusts a voltage loaded on the electrode of each of the sub-pixel structures, a first voltage may be firstly supplied to both the first switch electrode 041 and the second switch electrode 042 of the sub-pixel structure. Since the conductive structure is uncharged at this time, the conductive structure 03 moves towards the charged first switch electrode 041 or the charged second switch electrode 042 until the conductive structure 03 in the sub-pixel structure moves to the first position or the second position in the sub-pixel structure, such that the conductive structure 03 is electrically connected to the first switch electrode 041 or the second switch electrode 042 to load the first voltage on the conductive structure 03. At this time, the conductive structure 03 is changed from an uncharged state to a charged state.

In step 2202, a first voltage is supplied to one of the first drive electrode and the second drive electrode in each of the sub-pixel structures and a second voltage is supplied to the other of the first drive electrode and the second drive electrode, such that in each of the sub-pixel structures, the conductive structure loaded with the first voltage moves to the drive electrode loaded with the second voltage.

After the first voltage is loaded on the conducted structure of each of the sub-pixel structures, the display controller may provide the first voltage to one of the first drive electrode 051 and the second drive electrode 052 and provide the second voltage to the other of the first drive electrode 051 and the second drive electrode 052 such that the conductive structure loaded with the first voltage moves towards the drive electrode loaded with the second voltage.

For example, it is supposed that the conductive structure 03 is disposed at the first position at this time and the conductive structure 03 is loaded with the first voltage, and if the first drive electrode 051 is loaded with the first voltage and the second drive electrode 052 is loaded with the second voltage, the conductive structure 03 will move towards the second drive electrode 052 loaded with the second voltage based on a principle that opposite electrodes attract and like ones repel. On the contrary, if the first drive electrode 051 is loaded with the second voltage and the second drive electrode 052 is loaded with the first voltage, the conductive structure 03 will be attracted by the first drive electrode 051 loaded with the second voltage and thus keep still. In this way, the conductive structure 03 is controlled to move by applying different voltages to the first drive electrode 051 and the second drive electrode 052.

Optionally, still referring to FIG. 12, the plurality of sub-pixel structures in the display panel may be arranged in m rows and n columns, and the display panel further includes: m first switch signal lines 1031, m second switch signal lines 1032, n first drive signal lines 1041 and n second drive signal lines 1042. The display controller is connected to all the m first switch signal lines, the m second switch signal lines, the n first drive signal lines and the n second drive signal lines, wherein m≥1 and n≥1.

Since all the first switch electrodes of the sub-pixel structures in the $i^{th}$ row are connected to the $i^{th}$ first switch signal line, and all the second switch electrodes of the sub-pixel structures in the $i^{th}$ row are connected to the $i^{th}$ second switch signal lines, when supplying the first voltage to both the first switch electrode and the second switch electrode in each of the sub-pixel structures, the display controller may provide the first voltage to the first switch electrodes of the sub-pixel structures in the $i^{th}$ row by the $i^{th}$ first switch signal line and provide the first voltage to the second switch electrodes of the sub-pixel structures in the $i^{th}$ row by the $i^{th}$ second switch signal line.

Since all the first drive electrodes of the sub-pixel structures in the $j^{th}$ column of are connected to the $j^{th}$ first drive signal line and all the second drive electrodes of the sub-pixel structures in the $j^{th}$ column are connected to the $j^{th}$ second drive signal line, when supplying the first voltage to one of the first drive electrode and the second drive electrode and supplying the second voltage to the other of the first drive electrode and the second drive electrode, the display controller may provide the first voltage to the first drive electrodes of the sub-pixel structures in the $j^{th}$ column by the $j^{th}$ first drive signal line and provide the second voltage to the second drive electrodes of the sub-pixel structures in the $j^{th}$ column; or the display controller may provide the second voltage to the first drive electrodes of the sub-pixel structures in the $j^{th}$ column by the $j^{th}$ first drive signal line and provide the first voltage to the second drive electrodes of the sub-pixel structures in the $j^{th}$ column.

In step 2203, after the first voltage is supplied to one of the first drive electrode and the second drive electrode of the sub-pixel structure in the $i^{th}$ row and $j^{th}$ column and the second voltage is supplied to the other of the first drive electrode and the second drive electrode, a third voltage is supplied to both the first switch electrode and the second switch electrode of the sub-pixel structure in the $i^{th}$ row and $j^{th}$ column.

After supplying the first voltage to one of the first drive electrode and the second drive electrode of the sub-pixel structure in the $i^{th}$ line and $j^{th}$ column and supplying the second voltage to the other of the first drive electrode and the second drive electrode, the display controller may provide the third voltage to both the first switch electrode and the second switch electrode of the sub-pixel structure in the $i^{th}$ line and $j^{th}$ column by the $i^{th}$ first switch signal line and the $i^{th}$ second switch signal line to maintain a position of a conductive ball of the sub-pixel structure in the $i^{th}$ line and $j^{th}$ column unchanged when supplying the first voltage to one of the first drive electrode and the second drive electrode of sub-pixel structures in other row and supplying the second voltage to the other of the first drive electrode and the second drive electrode of sub-pixel structure in other row. The sub-pixel structures in the other row are sub-pixel structures in any row other than the $i^{th}$ row of the plurality of sub-pixel structures.

Optionally, the third voltage may be a mid-value of the first voltage and the second voltage, that is, a half of a sum of the first voltage and the second voltage. For example, when the first voltage is supplied to one of the first drive electrode and the second drive electrode of the sub-pixel structures in the $x^{th}$ row and the second voltage is supplied to the other of the first drive electrode and the second drive electrode, the conductive structure of the sub-pixel structure in the $i^{th}$ row and $j^{th}$ column is proximal to the drive electrode loaded with the second voltage. At this time, it is necessary for the display controller to provide the third voltage to the first switch electrode and the second switch electrode of the sub-pixel structure in the $i^{th}$ row and $j^{th}$ column by the $i^{th}$ first switch signal line and the $i^{th}$ second switch signal line. The conductive structure of the sub-pixel structure in the $i^{th}$ row and $j^{th}$ column is provided with the third voltage, and the conductive structure is still proximal to the drive electrode most proximal to the conductive structure (that is the drive electrode loaded with the second voltage before the third voltage is loaded) under the action of the first voltage and the second voltage loaded on the first drive electrode and the second drive electrode, such that after the third voltage is loaded, the conductive structure of the sub-pixel structure in the $i^{th}$ row and $j^{th}$ column can maintain the position unchanged.

When the first voltage is supplied to all the first switch electrodes and the second switch electrodes of the sub-pixel structures in the $(i+1)^{th}$ row by the $(i+1)^{th}$ first signal switch signal line and the $(i+1)^{th}$ second switch signal line, and the first voltage is supplied to one of the first drive electrode and the second drive electrode of the sub-pixel structures in the $(i+1)^{th}$ row and the second voltage is supplied to the other of the first drive electrode and the second drive electrode by the first drive signal line and the second signal line, since the conductive structures of the sub-pixel structures in the $i^{th}$ row are provided with the third voltage and if the voltages of the first drive electrodes and the second drive electrodes of the sub-pixel structures in the $i^{th}$ row are unchanged, the positions of the conductive structures are unchanged; and if the voltages of the first drive electrodes and the second drive electrodes of the sub-pixel structures in the $i^{th}$ row are interchanged, the conductive structures are still proximal to the drive electrode most proximal to the conductive structure (that is, the drive electrode loaded with the second voltage before the third voltage is loaded) under the action of the first voltage and the second voltage, the positions of the conductive structures are also unchanged. Therefore, regardless of whether the voltages of the first drive signal line and the second drive signal are changed, the conductive structure still can maintain the position unchanged, thereby preventing the position of the conductive structure from being changed when the voltage is applied to the drive electrode of the sub-pixel structure in other row of.

Figure 23:
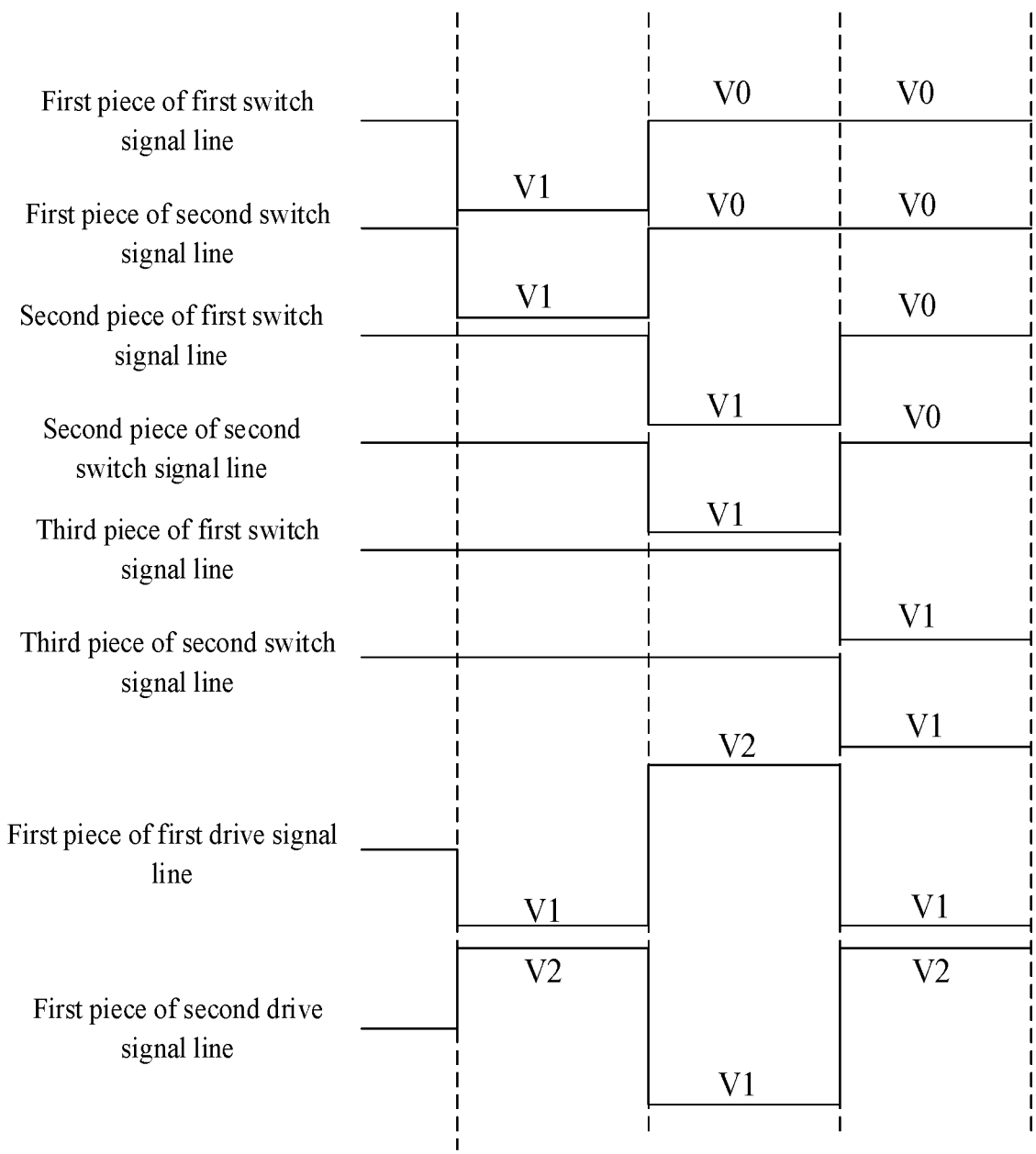
FIG. 23 is a timing diagram according to an embodiment of the present disclosure.

The method for controlling the display panel shown in FIG. 12 is illustrated by taking the first voltage is V1, the second voltage is V2, the third voltage is V0, V1<V0<V2 and V0=(V1+V2)/2 as an example and with reference to the timing shown in FIG. 23.

For example, each conductive structure in the display panel is uncharged before the display panel displays an image.

Referring to FIG. 23, when it is necessary to control the display panel to display a frame of image, the display controller may firstly provide the first voltage V1 to the first piece of first switch signal line and the first piece of second switch signal line to provide the first voltage V1 to all the first switch electrodes and the second switch electrodes of the sub-pixel structures in the first row, such that the conductive structures of the sub-pixel structures in the first row is loaded with the first voltage V1. After that, the display controller may control the conductive structure in the sub-pixel structure to move according to a luminance of light required to be emitted by each of the sub-pixel structures in the first row. For example, for the first sub-pixel structure in the first row, the display controller may respectively apply the first voltage V1 and the second voltage V2 to the first piece of first drive signal line and the first piece of second drive signal line, such that the conductive structure in the sub-pixel structure moves towards the drive electrode loaded with the second voltage V2. After the conductive structures of the sub-pixel structures in the first row are controlled to move, the third voltage V0 may be supplied to both the first piece of first switch signal line and the first piece of second switch signal line, and thus the third voltage V0 is supplied to all the first switch electrodes and the second switch electrodes of the sub-pixel structures in the first row, and the conductive structures of the sub-pixel structures in the first row are loaded with the third voltage V0.

Then, the display controller may supply the first voltage V1 to the second piece of first switch signal line and the second piece of second switch signal line to such that the first switch electrodes and the second switch electrodes of the sub-pixel structures in the second row are all provided with the first voltage V1, and hence the conductive structures of the sub-pixel structures in the second row are loaded with the first voltage V1. After that, the display controller may input voltages to the first drive signal line and the second drive signal line according to the luminance of light required to be emitted by each of the sub-pixel structures in the second row, thereby controlling the conductive structure of each of the sub-pixel structures in second row to move. For example, for the first sub-pixel structure in the second row, the display controller may respectively apply the first voltage V1 and the second voltage V2 to the first piece of first drive signal line and the first piece of second drive signal line, such that the conductive structure in the sub-pixel structure moves towards the drive electrode loaded with the second voltage V2. In addition, since the conductive structures of the sub-pixel structures in the first row are loaded with the third voltage V0 at this time, regardless of whether the voltages of the first drive signal line and the second drive signal line which are connected to the first row of sub-pixel structures are changed, the conductive structures in the sub-pixel structures will not move. After the conductive structures of the sub-pixel structures in the second row are controlled to move, the third voltage V0 may be supplied to both the second piece of first switch signal line and the second piece of second switch signal line, such that the third voltage V0 is supplied to all the first switch electrodes and the second switch electrodes of the sub-pixel structures in the second row, and thus the conductive structures of the sub-pixel structures in the second row are loaded with the third voltage V0.

After that, the sub-pixel structures in the third row, and the sub-pixel structures in the fourth row to the sub-pixel structures in the $m^{th}$ row may be sequentially controlled with reference to the foregoing process, which is not repeated in the embodiment of the present disclosure. Optionally, FIG. 23 only shows the change situations of the voltages on the first to third pieces of first switch signal lines, the first to third pieces of second switch signal lines, the first piece of first drive signal line and the first piece of second drive signal line in the process of controlling the sub-pixel structures from the first row to the third row, and the change situations of the voltages on other signal lines may be referenced to the change situations of the voltages on the signal lines shown in FIG. 22, which are not repeated herein in the embodiment of the present disclosure.

In addition, in a liquid display panel according to the related art, generally, in order to ensure that one row of sub-pixel structures can continuously maintain a light-emitting state in the process of controlling sub-pixel structures in other rows to emit light when the row of sub-pixel structures are controlled to emit light, it is necessary to charge a storage capacitor in the row of sub-pixel structures, and it is necessary to consume more electric energy in the charging process. However, in the display panel according to the embodiment of the present disclosure, when each row of sub-pixel structures emit light, it may ensure that the row of sub-pixel structures can maintain the original light-emitting state in the process of controlling other rows of sub-pixel structures to emit light only by loading the third voltage to the conductive structures in the row of sub-pixel structures. Loading the third voltage to the conductive structure consumes less energy than that consumed by charging the storage capacitor in the related art; therefore, the display panel according to the embodiment of the present disclosure is low in energy consumption.

When it is necessary to control the display panel to display the next frame of image, the display controller may start from the first row of sub-pixel structures again and sequentially control the sub-pixel structure in each row of sub-pixel structures to achieve bright state display or dark state display with reference to the process of controlling the display panel to display the previous frame of image of the next frame of image, which is not elaborated herein in the embodiment of the present disclosure.

Meanwhile, in the electronic paper according to the related art, since the capsule can move in the electronic paper, the capsules in the electronic paper agglomerate, and thus other capsules agglomerated with the capsule are controlled when a certain capsule is controlled to display a bright state or a dark state, and the display effects of all regions of the display panel are non-uniform. However, the positions of the sub-pixel structures in the display panel according to the embodiment of the present disclosure are fixed and the sub-pixel structures are independently controlled, and no agglomeration phenomenon of the sub-pixel structures will appear and thus the display effects of all regions of the display areas are uniform.

The embodiment of the present disclosure provides a storage medium, storing a computer instruction suitable for execution by a processor, wherein the computer instruction, when being executed by the processor, enables the processor to perform the method for controlling display panel according to the embodiment of the present disclosure.

Figure 24:
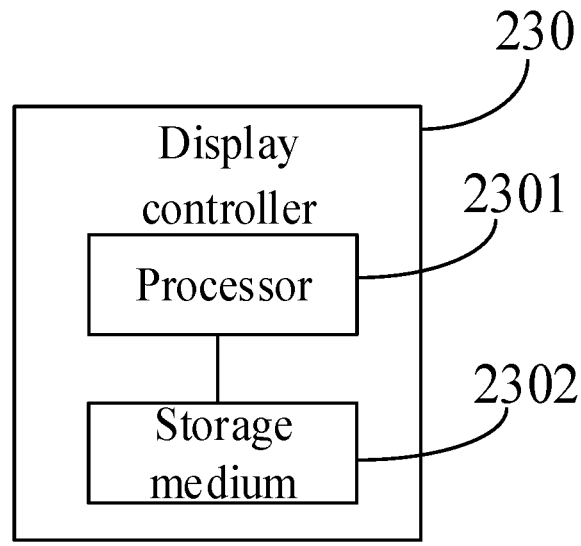
FIG. 24 is a schematic structural diagram of a chip according to an embodiment of the present disclosure.

The embodiments of the present disclosure further provide a display controller. The display controller is configured to perform the display control method according to the embodiment of the present disclosure. For example, FIG. 24 is a schematic structural diagram of a display controller according to an embodiment of the present disclosure. As shown in FIG. 24, the display controller 230 may include a processor 2301 and a storage medium 2302. The storage medium 2302 is configured to store a computer instruction suitable for execution by the processor 2301. The computer instruction, when being executed by the processor 2301, is configured to enable the processor to perform the method for controlling the display panel according to the embodiment of the present disclosure. Optionally, the display controller may further be a chip or a circuit structure.

Figure 25:
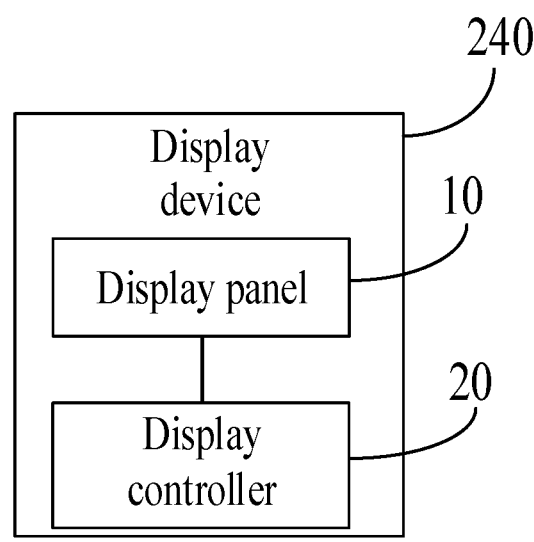
FIG. 25 is a schematic structural diagram of a display device according to an embodiment of the present disclosure.

FIG. 25 is a schematic structural diagram of a display device according to an embodiment of the present disclosure. As shown in FIG. 25, the display device 240 may include: a display panel 10 and a display controller 20 according to the embodiments of the present disclosure, wherein the display panel 10 may be the display panel shown in FIG. 11 or FIG. 12, and the display controller 20 may be shown as FIG. 24.

For example, the display device may be any product or component having a display function such as a mobile phone, a tablet computer, a television, a display, a notebook computer, a digital photo frame, a navigator, or the like.

Optionally, the method embodiments according to the embodiments of the present disclosure and the embodiments of the corresponding display controller may be reference to each other, which are not limited in the embodiments of the present disclosure. The sequence of the steps of the embodiments of the method according to the embodiments of the present disclosure may be properly adjusted, the steps may be increased or reduced correspondingly according to the conditions, and any methods which those skilled in the art may think in the technical scope disclosed by the present disclosure should be covered within the protection scope of the present disclosure, which are thus not be elaborated herein.

The above descriptions are only merely optional embodiments of the present disclosure, but are not intended to limit the present disclosure. Within the spirit and principles of the present disclosure, any modifications, equivalent substitutions, improvements, or the like are within the protection scope of the present disclosure.

What is claimed is:

1. A sub-pixel structure, comprising: a first functional layer and a second functional layer which are opposite to each other, a conductive structure between the first functional layer and the second functional layer, and a plurality of electrodes on at least one side of the first functional layer; wherein
   the first functional layer comprises an insulating region, the second functional layer comprises a target light-shielding region and a target light-transmitting region, wherein orthographic projections of both the conductive structure and the target light-transmitting region on the first functional layer are partial regions of the insulating region, and orthographic projections of the plurality of electrodes on the first functional layer are outside the insulating region; and
   the conductive structure is configured to move in the insulating region under the action of voltages loaded on the plurality of electrodes to adjust a luminous flux of light emitted from the target light-transmitting region; and
   wherein the insulating region is recessed on a side, proximal to the second functional layer, of the first functional layer to prevent the conductive structure from rolling out of the insulating region during a movement.

2. The sub-pixel structure according to claim 1, wherein the conductive structure comprises a conductor ball.

3. The sub-pixel structure according to claim 2, wherein the target light-transmitting region meets one of following conditions:
   the target light-transmitting region is a colorless and transparent region;
   the target light-transmitting region is a color-filtering region.

4. The sub-pixel structure according to claim 1, wherein the conductive structure is light-shielding; and
   a surface, facing the second functional layer, of the first functional layer is provided with a light-adjusting region in the insulating region, the light-adjusting region is reflective or photoluminescent, and an orthographic projection of the target light-transmitting region on the first functional layer is within the light-adjusting region.

5. The sub-pixel structure according to claim 4, wherein the first functional layer comprises: a functional layer body and an insulating block on a side, proximal to the second functional layer, of the functional layer body; and
   a region where the insulating block is disposed is the light-adjusting region, and a side, proximal to the second functional layer, of the insulating block is reflective or photoluminescent.

6. The sub-pixel structure according to claim 1, wherein the conductive structure is reflective or photoluminescent; and
   a surface, facing the second functional layer, of the first functional layer is provided with an auxiliary light-shielding region in the insulating region, wherein an orthographic projection of the target light-transmitting region on the first functional layer is within the auxiliary light-shielding region.

7. The sub-pixel structure according to claim 1, wherein the conductive structure is light-shielding; and
   the insulating region comprises an auxiliary light-transmitting region, wherein an orthographic projection of the target light-transmitting region on the first functional layer is within the auxiliary light-transmitting region.

8. The sub-pixel structure according to claim 7, wherein the target light-transmitting region and the auxiliary light-transmitting region meet one of following conditions:
   both the target light-transmitting region and the auxiliary light-transmitting region are colorless and transparent regions;
   one of the target light-transmitting region and the auxiliary light-transmitting region is a colorless and transparent region, and the other is a color-filtering region;
   both the target light-transmitting region and the auxiliary light-transmitting region are color filtering regions, and a wavelength set of light which the target light-transmitting region allows to pass through and a wavelength set of light which the auxiliary light-transmitting region allows to pass through have an intersection.

9. The sub-pixel structure according to claim 1, wherein the plurality of electrodes comprise: a first switch electrode and a second switch electrode;
   the conductive structure is configured to move between a first position and a second position in the insulating region under the action of voltages loaded on the plurality of electrodes; wherein the first position is a position which is most proximal to the first switch electrode in the insulating region, and the second position is a position which is most proximal to the second switch electrode in the insulating region;
   when the conductive structure is at the first position, an orthographic projection of the target light-transmitting region on the first functional layer is within an orthographic projection of the conductive structure on the first functional layer; and
   when the conductive structure is at the second position, the orthographic projection of the target light-transmitting region on the first functional layer is outside the orthographic projection of the conductive structure on the first functional layer.

10. The sub-pixel structure according to claim 9, wherein the plurality of electrodes further comprise: a first drive electrode and a second drive electrode;
    the first switch electrode and the second switch electrode are on a side, proximal to the second functional layer, of the first functional layer, and the first drive electrode and the second drive electrode are on a side, distal from the second functional layer, of the first functional layer; and the first switch electrode and the first drive electrode are on a same side of the insulating region, and the second switch electrode and the second drive electrode are on a same side of the insulating region.

11. A display panel, comprising: a first substrate and a second substrate which are arranged oppositely, and a plurality of sub-pixel structures disposed between the first substrate and the second substrate and arranged in an array, wherein the sub-pixel structure comprises:

a first functional layer and a second functional layer which are opposite to each other, a conductive structure between the first functional layer and the second functional layer, and a plurality of electrodes on at least one side of the first functional layer; wherein the first functional layer comprises an insulating region, the second functional layer comprises a target light-shielding region and a target light-transmitting region, wherein orthographic projections of both the conductive structure and the target light-transmitting region on the first functional layer are partial regions of the insulating region, and orthographic projections of the plurality of electrodes on the first functional layer are outside the insulating region; and the conductive structure is configured to move in the insulating region under the action of voltages loaded on the plurality of electrodes to adjust a luminous flux of light emitted from the target light-transmitting region; and wherein the insulating region is recessed on a side, proximal to the second functional layer, of the first functional layer to prevent the conductive structure from rolling out of the insulating region during a movement.

12. The display panel according to claim 11, wherein the plurality of sub-pixel structures comprise m rows and n columns of sub-pixel structures; the display panel further comprises: m first switch signal lines, m second switch signal lines, n first drive signal lines and n second drive signal lines which are between the first substrate and the second substrate; any two of the m first switch signal lines, the m second switch signal lines, the n first drive signal lines and the n second drive signal lines are insulated, wherein $m \geq 1$ and $n \geq 1$; and in a sub-pixel structure in an $i^{th}$ row and $j^{th}$ column of the plurality of sub-pixel structures, the first switch electrode is connected to an $i^{th}$ first switch signal line, the second switch electrode is connected to an $i^{th}$ second switch signal line, the first drive electrode is connected to a $j^{th}$ first drive signal line, and the second drive electrode is connected to a $j^{th}$ second drive signal line, wherein $1 \leq i \leq m$ and $1 \leq j \leq n$.

13. The display panel according to claim 12, wherein the first functional layer, the plurality of electrodes, the first switch signal line, the second switch signal line, the first drive signal line and the second drive signal line in the sub-pixel structure are on a side, proximal to the second substrate, of the first substrate; and the second functional layer in the sub-pixel structure is on a side, proximal to the first substrate, of the second substrate.

14. The display panel according to claim 13, wherein the first switch electrode, the second switch electrode, the first switch signal line, and the second switch signal line are on a same layer, and the first drive electrode, the second drive electrode, the first drive signal line, and the second drive signal line are on a same layer.

15. A display device, comprising the display panel according to claim 11 and a display controller, wherein the display controller is configured to adjust voltages loaded on the plurality of electrodes in the sub-pixel structure of the display panel such that a conductive structure in the sub-pixel structure moves in an insulating region of the sub-pixel structure.

\* \* \* \* \*